United States Patent [19]

Hooper et al.

[11] Patent Number: 5,151,867

[45] Date of Patent: Sep. 29, 1992

[54] METHOD OF MINIMIZING SUM-OF-PRODUCT CASES IN A HETEROGENEOUS DATA BASE ENVIRONMENT FOR CIRCUIT SYNTHESIS

[75] Inventors: Donald F. Hooper, Northborough; James L. Finnerty, Lexington; David B. Fite, Northborough; Snehamay Kundu, Marlboro, all of Mass.

[73] Assignee: Digital Equipment Corporation, Maynard, Mass.

[21] Appl. No.: 373,086

[22] Filed: Jun. 28, 1989

Related U.S. Application Data

[63] Continuation-in-part of Ser. No. 907,303, Sep. 12, 1986, abandoned.

[51] Int. Cl.⁵ .................. G06F 15/60; G06F 15/40
[52] U.S. Cl. ........................ 364/489; 364/488; 395/600; 395/921
[58] Field of Search ............... 364/488, 489, 490, 491; 395/600, 921, 51, 54, 60, 62

[56] References Cited

U.S. PATENT DOCUMENTS

| | | | |
|---|---|---|---|
| 4,510,616 | 4/1985 | Lougheed et al. | 364/490 |
| 4,554,631 | 11/1985 | Reddington | 364/300 |
| 4,613,940 | 9/1986 | Shenton et al. | 364/490 |
| 4,656,603 | 4/1987 | Dunn | 364/490 |
| 4,700,317 | 10/1987 | Watanabe et al. | 364/488 |
| 4,703,435 | 10/1987 | Darringer et al. | 364/489 |
| 4,922,432 | 5/1990 | Kobayashi et al. | 364/490 |
| 4,937,755 | 6/1990 | Yokota et al. | 364/488 |

FOREIGN PATENT DOCUMENTS 1445914  8/1976  United Kingdom ............... 364/490

OTHER PUBLICATIONS

Shinsha et al., "Incremental Logic Synthesis Through Gate Logic Structure Identification," 23rd Design Automation Conference, 1986, pp. 391-397.
Friedman et al., "Quality of Design from an Automatic Logic Generator (Alert)," IEEE 1970 7th Design Automation Conf., pp. 71.
Friedman et al., "Methods Used in an Automatic Logic Design Generator (Alert)," IEEE Trans. Computer, vol. C-18, No. 7, Jul. 1969, pp. 593-613.
Darringer et al., "Logic Synthesis Through Local Transformations", IBM Journal vol. 25, No. 4, Jul. 1981, pp. 272-280.
Darringer et al., "A New Look at Logic Synthesis," IEEE 1980 17th Design Automation Conf., pp. 543-548.
"Diverse Design Tools Break into Logic-Synthesis Arena", System Technology; Computer Design, Oct. 15, 1987, pp. 20-21.
TOPS-20 Commands Reference Manual, AA-511-5B-TM, AD-5115B-T1, Version 5, Arl 1982, pp. 275-276.

(List continued on next page.)

Primary Examiner—Parshotam S. Lall
Assistant Examiner—V. N. Trans
Attorney, Agent, or Firm—Finnegan, Henderson, Farabow, Garrett and Dunner

[57] ABSTRACT

A method for simplifying Boolean AND-OR logic in a circuit synthesis system. Rules are associated with model instances representing circuit components and contained in a data base. During testing of an antecedent portion of a rule, a benefit value representing a decrease in pins or an improvement in timing is calculated and compared to the value of a "benefit variable", which represents a minimum acceptable benefit that must be gained from application of a rule. If a sufficient benefit will result from application of the rule, the rule is applied. Some rules simplify the circuit and then recursively call themselves. Some rules indicate other model instances in the data base, search the set of rules for rules applicable to that model instance, and apply the rule discovered during the search.

38 Claims, 14 Drawing Sheets

OTHER PUBLICATIONS

T. J. Kowalski and D. E. Thomas, "The VLSI Design Automation Assistant: What's in a Knowledge Base," 22nd Design Automation Conference, Paper 18.1, 1985, pp. 252-258.

Kurt Keutzer, "DAGON: Technology Binding and Local Optimization by DAG Matching," 24th ACM-/IEEE Design Automation Conference, Paper 21.1, 1987, pp. 341-347.

William H. Joyner, Jr., Louise H. Treyillvan, Daniel Brand, Theresa A. Nix, and Steven C. Gundersen, "Technology Adaptation in Logic Synthesis," 23rd Design Automation Conference, Paper 6.3, 1986, pp. 94-100.

Aart J. de Geus and William Cohen, "A Rule-Based System for Optimizing Combinational Logic," IEEE Design & Test, 1985, pp. 22-32.

Robert K. Brayton, Richard Rudell, Alberto Sangiovanni-Vincentelli, and Albert R. Wang, "MIS: A Multiple-Level Logic Optimization System," IEEE Transactions on Computer-Aided Design, vol. CAD-6, No. 6, Nov. 1987, pp. 1062-1081.

R. Brayton, R. Rudell, A. Sangiovanni-Vincentelli, and A. Wang, "Multi-Level Logic Optimization and The Rectangular Covering Problem," Department of Electrical Engineering and Computer Science, University of California, Berkeley, IEEE, 1987, pp. 66-69.

Forgy, "OPS5 User's Manual," Department of Computer Science, Carnegie-Mellon University, Jul. 1981.

RULE FORMAT

| | DATA BASE | ANTECEDENT T/F | SIZEWIN GROUPING |
|---|---|---|---|
| MODEL INSTANCE $i_1$ | $r_1$ (5) | F | SIZEWIN = 5 |
| | $r_5$ (2) | T | $i_3, r_3$ |
| | $r_7$ (1) | T | $i_6, r_6$ |
| $i_2$ | $r_2$ (3) | T | SIZEWIN = 4 |
| | $r_4$ (2) | T | $i_8, r_8$ |
| $i_3$ | $r_3$ (5) | T | SIZEWIN = 3 |
| | | | $i_2, r_2$ |
| | | | $i_4, r_2$ |
| $i_4$ | $r_2$ (3) | T | SIZEWIN = 2 |
| | $r_4$ (2) | T | $i_1, r_5$ |
| $i_5$ | $r_5$ (2) | F | SIZEWIN = 1 |
| | $r_7$ (1) | F | $i_7, r_7$ |
| | $r_8$ (4) | F | |
| $i_6$ | $r_6$ (5) | T | SIZEWIN = 0 |
| $i_7$ | $r_7$ (1) | T | — |
| $i_8$ | $r_8$ (4) | T | |

*FIG. 9*

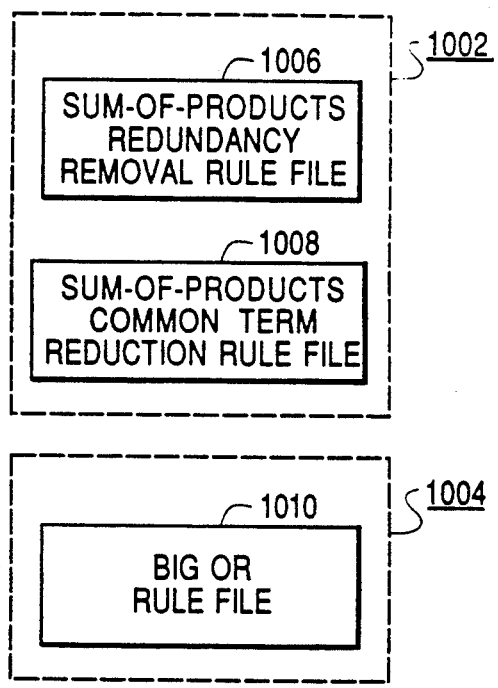
FIG. 10
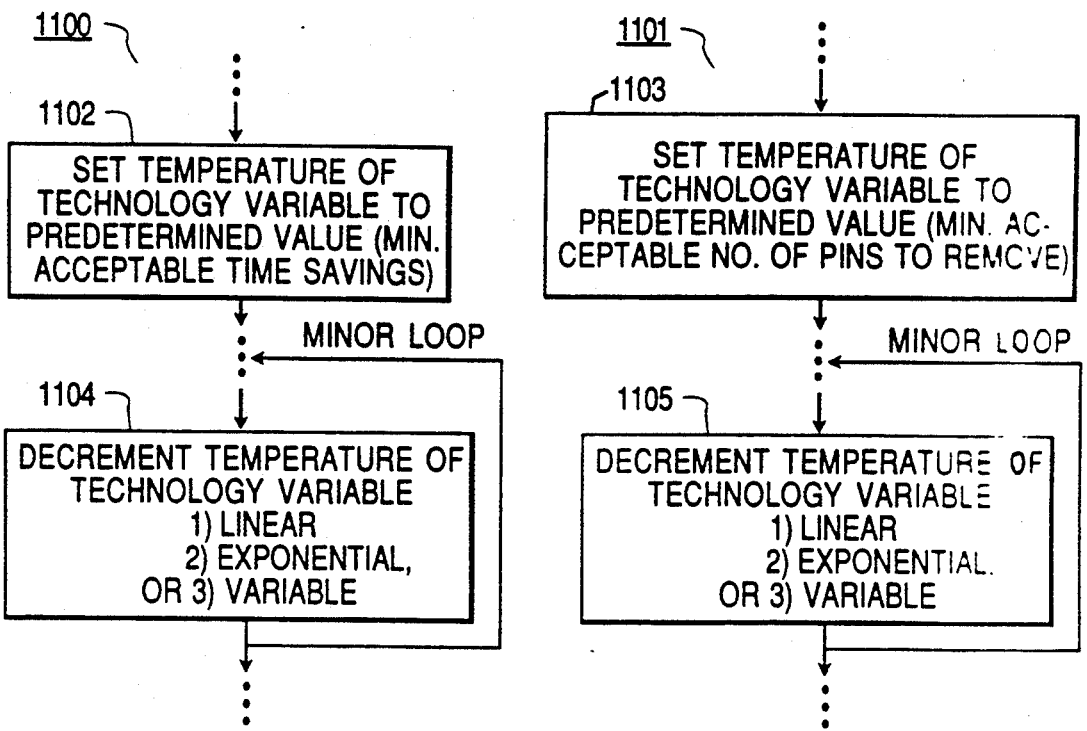
FIG. 11(a)  FIG. 11(b)

```
(DEFRULE "FACTOR OR, 1 COMMON SUBTERM"                1200
   : SIZEWIN 2                            1206
                                                                                  1202
   (MODEL IS OR)
   (NO MODELS-SOURCES ARE CONNECT)
   (ANY MODEL-{ANDS}-SOURCES IS AND)
   (COUNT-{ANDS} IS_GREATER _THAN 1)
   (NO CONSTANT-SIGNAL-INS-{ANDS} IS_A_NUMBER)
   (FOUND {TERMS}-{ANDS} HAVE_1_COMMON_INPUT "TAG")
   ({COM_SIGS} <- SIGNALS-TAG)
1208
   ;; THOSE SOURCES LEFT ALONE
   (ANY_OR_NO {UNAFFECTED_TERMS}-SOURCES ARE_NOT_IN {TERMS})

;; THOSE WITH FANOUT TREATED SPECIAL
   (ANY_OR_NO COUNT-DESTS {FAN_ANDS}-{TERMS} > 1)

;; BENEFIT IS (M-1)N, WHERE M IS TERMS, N IS COMMON SUBTERM
   (OR (COUNT-{TERMS} = COUNT-INS) ;; IF ALL, GO WITH IT
1212                                                                               1214
   TEMPERATURE-TECHNOLOGY < (({ } 1- (({ } - COUNT-{TERMS} COUNT-{FAN_ANDS}))))

1204
   (FOR_ EACH {I} - {FAN_ANDS}
      ;; REMOVE THE COMMON SUBTERMS OF *INSTANCE* ONLY
      (ANY_OR_NO INSTANCE-{OTHER_LOADS} - LOADS-1ST-OUT-{I}
              IS_NOT_SAME_AS *INSTANCE*)
      (IF (COUNT-{OTHER_LOADS} > 0) THEN
          INSERT (NIL) = (AND INS-{I})) ; INSERT THE DUPLICATE AND
          (MAKE_NEW_SIGNAL_FOR 1ST-OUT-1ST-INSTANCE-PARENT)
          (MOVE_LOADS {OTHER_LOADS} TO SIGNAL-1ST-OUT-1ST-
                 INSTANCE-PARENT)
      )
   )
   (IF (COUNT-{UNAFFECTED_TERMS} = 0)   ;; IF ALL SOURCES HAVE THE COMMON
       THEN                                                            ; INPUTS
       (REPLACE *INSTANCE* WITH
              1ST-OUT = (AND TAG (OR OUTS-{TERMS})))
       ELSE
   (REPLACE *INSTANCE* WITH
              1ST-OUT = (OR OUTS-{UNAFFECTED_TERMS}
                            (AND TAG (OR OUTS-{TERMS}))))
   )
   ;; REMOVE THE COMMON SUBTERMS OF *INSTANCE* ONLY
   (FOR_EACH {I} - {TERMS}
      (ANY SIGNALS-{R}-INS-{I} ARE_IN {COM_SIGS})
      (MOVE_LOADS {R} TO (({ } FIND-SIGNAL "TIE_HI"))
   )
   (TRY_FIRE&APPLY {TERMS}) ; REMOVE THE TIE_HI
)
```

*FIG. 12*

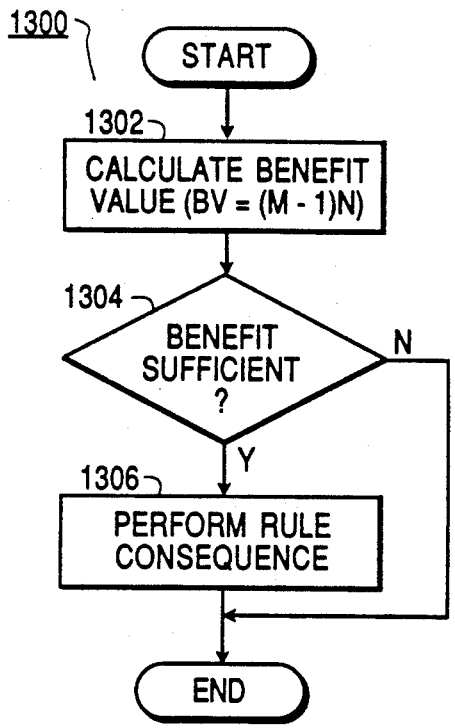

FIG. 13

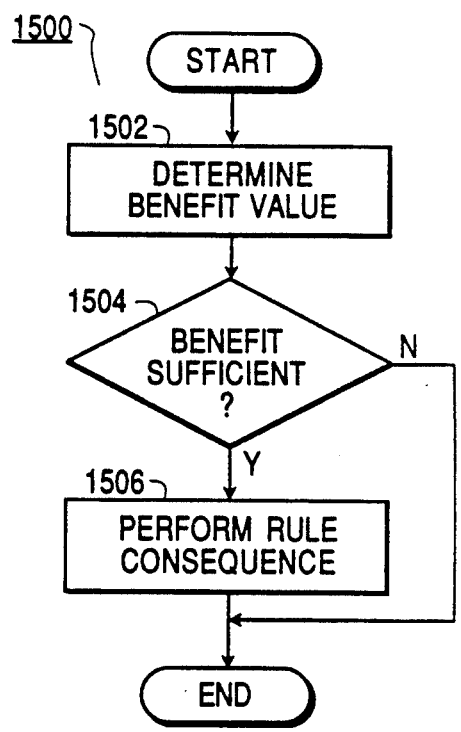

FIG. 15

1408 ⏋       1400 ⏋
;;; THE FOLLOWING RULES WILL GENERATE A TWIN DRIVE FOR UDNERLOADED
;;; SIGNALS IN TIMINGDEBT

1406 ⏋
(DEFRULE "HIGH DRIVE CASE 1"

```
(COUNT-OUTS > 1)
(SIGNAL-1ST-OUT IS PRESENT)
(COUNT-LOADS-1ST-OUT > 0)  ; NOT AN OUTPUT
(PORTDEF-SIGNAL-1ST-OUT IS NOT PRESENT)
(TIMINGDEBT-1ST-OUT > TEMPERATURE-TECHNOLOGY)
```
                                                                    1402
```
(ADJ_LOADCOUNT-1ST-OUT <= MAX_CRITICAL LOADS-TECHNOLOGY)
(1ST-EQUIV-1ST-OUT IS_SAME_AS 2ND-OUT)
(SIGNAL-2ND-OUT IS_NOT PRESENT)
```
                                                           1412
1404 ⏋
```
(SET_SIZE_WIN 1)
(MODIFY SIGNAL-2ND-OUT WITH SIGNAL-1ST-OUT)
( ) PUSH 2ND-OUT DRIVERS-SIGNAL-1ST-OUT)
(TRY_ FIRE&APPLY *INSTANCE*)
```
)

FIG. 14

```
                            ┌────1600────┐
      ┌─1606                 ┌──────────────────────────────┐  ┌─1606
      (DEFRULE │ "PULL 5-4-3-2 AND/OR FROM BIG OR" │
                └──────────────────────────────────┘
  1608 ─ "EXPECT THIS TREE TO MAP TO L618"
      ┌────────────────────────────────────────────────── ─1602 ─ ─
      │ (MODEL IS OR)
      │ (COUNTS-INS >= 7)
      │ (ANY MODEL-TAG-SOURCES IS AND)   ; MARK AND'S     ┌─1630
      │ (ANY SIGNALS-OUTS-TAG1-TAG ARE_NOT_FROZEN) ──┘
      │ (ANY INCOUNT-TAG5-TAG1 IS 5)    ; 5 IN ANDS.
      │ (ANY INCOUNT-TAG4-TAG1 IS 4)    ; 4 IN ANDS.
      │ (ANY INCOUNT-TAG3-TAG1 IS 3)    ; 3 IN ANDS.
      │ (ANY INCOUNT-TAG2-TAG1 IS 2)    ; 2 IN ANDS.
      └──────────────────────────────────────────────────────
 1610 ─ ──── ▶                                         ┌─1604
      ┌──────────────────────────────────────────────────── ─
      │ (SET-SIZE-WIN 5)
      │ (REPLACE *INSTANCE* WITH
      │     1ST-OUT = (OR      INS
      │                        (OR  1ST-OUT-1ST-TAG5
      │                             1ST-OUT-1ST-TAG4
      │                             1ST-OUT-1ST-TAG3
      │                             1ST-OUT-1ST-TAG2)
      │                        ERASE-1ST-OUT-1ST-TAG5
      │                        ERASE-1ST-OUT-1ST-TAG4
      │                        ERASE-1ST-OUT-1ST-TAG3
      │                        ERASE-1ST-OUT-1ST-TAG2
      │                   )
      │     )
      │ (REMOVE_IF_NO_ DESTS (1ST-TAG5 1ST-TAG4 1ST-TAG3 1ST-TAG2
      │ (LISP (LET* ((ALLINSTS (INSTANCES-OF *MODELDEF*))
      │ ┌──────────────────────────────────────────────────┐
 1612 ─┤│(BIGOR (FIRST ALLINSTS)))                         │
      │ └──────────────────────────────────────────────────┘
 1614 ─┤│(SETQ *INSTANCE* (SECOND ALLINSTS))               │
 1616 ─┤│(TRY-FIRE-AGAIN)   ; CONVERT LITTLE OR TO MCELL.  │
 1618 ─┤│(SETQ *INSTANCE* BIGOR)   ; NEXT TRY ON BIG OR.   │
 1620 ─┤│(WHEN (>& (LENGTH (INS-OF *INSTANCE*)) 6)         │
      │ │      (TRY-FIRE-AGAIN))))                         │
      │ └──────────────────────────────────────────────────┘
      )
```

*FIG. 16*

BIG - OR

METHOD OF MINIMIZING SUM-OF-PRODUCT CASES IN A HETEROGENEOUS DATA BASE ENVIRONMENT FOR CIRCUIT SYNTHESIS

This application is a continuation-in part of U.S. application Ser. No. 06/907,303, entitled "Procedure and Data Structure for Synthesis and Transformation of Logic Circuits," filed Sept. 12, 1986 now abandoned.

RELATED APPLICATIONS

This application is related to the following applications, which are assigned to the same assignee, and are currently pending in the United States Patent and Trademark Office:

1) U.S. application Ser. No. 06/907,512 of Hooper et al., entitled "Rule Structure In A Procedure Of The Synthesis Of Logic Circuits," filed Sept. 12, 1986.

2) U.S. application Ser. No. 06/907,513 of Hooper et al., entitled "Rule Structure For Insertion Of New Elements In A Circuit Design Synthesis Procedure," filed Sept. 12, 1986.

3) U.S. application Ser. No. 06/907,514 of Hooper, entitled "Procedure For Incorporating Timing Parameters In The Synthesis Of Logic Circuit Design," filed Sept. 12, 1986.

4) U.S. application Ser. No. 06/907,515 of Hooper, entitled "Data Base Access Method For Rules Utilized By A Synthesis Procedure For Logic Circuit Design," filed Sept. 12, 1986.

5) U.S. application Ser. No. 06/907,516 of Hooper et al., entitled "Bitwise Implementation Mechanism For A Circuit Design Synthesis Procedure," filed Sept. 12, 1986.

The disclosure of each of the five related applications, listed above, as well as the disclosure of U.S. application Ser. No. 06/907,303, is herein expressly incorporated by reference.

BACKGROUND OF THE INVENTION

This application relates to design of electrical circuits and semiconductor devices and, more particularly, to a knowledge based expert system for transforming a high level design entered by a user to a technology level representation of the design needed to manufacture a semiconductor device incorporating the design.

Design of an integrated circuit (IC) semiconductor device begins with a specification describing the overall function of the device. For example, a multiplier circuit may be specified to multiply two numbers together. If the input characteristics of the two numbers are known and the characteristics of the resultant output are known, the overall function of the multiplier circuit can be described. Other factors, such as power consumption, number of input and output connectors (I/O pins), and timing, may be included in the overall description of the circuit.

Semiconductor devices may be manufactured by a wide variety of processes or "technologies," such as TTL (transistor-transistor logic), CMOS (complementary metal oxide semiconductor), NMOS (N-channel metal oxide semiconductor), etc. Thus, it is important to be able to transform a generic high-level logic design into circuit components of a technology appropriate to a specific application.

A description of the desired circuit that spells out in detail the characteristics of the completed circuit is known as a high level design description. For example, a high level logic design description or, more simply, a high-level design may spell out the characteristics of a multiplier circuit. Such a description may specify one or more types of components, but does not necessarily designate specific components or how the components are connected. From the perspective of the opposite end of the design process, the required output of the process is a series of instructions which can be used by production machinery to actually form semiconductor raw materials into patterns and layers of metal and semiconductor material forming the desired circuit and to fabricate the IC device on a production line. Such a series of instructions is known as a "technology level representation" of the circuit.

The process of transforming the high-level design into a technology level representation is called "logic synthesis." The high-level design is initially represented in an artificial intelligence data base. The data base may include many different types of elements performing many different types of functions. Examples of elements are model definitions, model instances, port definitions, port instances, and signals. These elements are described in more detail below. The data base may also contain elements performing the same functions, but having different operating characteristics. Elements can be combined in many different combinations, but of course, not every type of element is operable with every other type, and not all elements within a given type are operable with all other elements of the same type.

There are, thus, a large number of "rules," which govern the combinations of elements within the data base. The logic synthesis process continuously and iteratively alters the design stored in the data base according to the rules. Thus, the logic synthesis process creates a more and more detailed description of a set of elements within the data base. The final result of the logic synthesis process is a technology representation that can be manufactured with, for example, computer aided manufacturing (CAM) techniques.

Logic synthesis thus involves selecting and combining elements of the data base according to the rules to transform a high-level design, which is initially stored in the data base, to a technology level representation.

Typically, the data base contains a library of logic element "model definitions" that are organized by function (e.g., Boolean components, adders, etc.) and by technology (e.g., TTL, CMOS, etc.) and a library of rules ( a "rules library") for applying to specific instances of the model definitions.

One such data base is described in the above-referenced application Ser. No. 06/907,303, the disclosure of which is herein expressly incorporated by reference. In this data base, each model definition has associated parameters that describe function, timing, power, size, and other general attributes of circuit components. Each model definition has associated with it one or more "model instances." Each model instance describes a component that meets the criteria of the model definition.

The rules library typically contains hundreds of rules that are organized into one or more "rule bases" according to rule type and applicability. The rules are associated with the model definitions, model instances, and rule bases through a set of pointers that are established when the rules library is loaded into the data base.

The high-level design description is usually a detailed specification of the desired behavior of the device to be designed. As the high level design is loaded into the system, it is described by an initial set of model instances that are typically quite generic, i.e., the initial model instances usually do not define any specific component or technology. As described in the above-identified application, a set of bidirectional pointers are established by the data base between the initial model instances so that the initial set of model instances are interconnected to define the design at a high level. A pointer is also established between each model instance and the model definition with which it is associated in the data base, and pointers are also established between each such model definition and the rules in the rule base that are associated with it. A single model definition may have more than one associated model instance. However, a single model instance is an instance of only one model definition.

The rules are then tested and applied to each model instance according to a predetermined procedure to determine if the model instance (and possibly adjacent model instances connected to the model instance via the bidirectional pointers) can be replaced with new model instances, which are more specific in either in function or technology or both. As model instances are replaced by more specific model instances through the application of the rules, bidirectional pointers are established between the new set of model instances to again define the logic design, this time at a slightly more specific level. Rules are then applied to the model definitions pointed to by this set of model instances to replace them with an even more specific set of model instances.

This iterative procedure continues until the original high level design description has been transformed to a low level description of the design implemented with circuit elements chosen from the technology (such as CMOS) targeted by the user. This low-level description constitutes a final design, which is in the form of a data structure that represents an interconnection between the actual components that are to be used to manufacture the design. The data structure can then be input to a conventional Computer Aided Manufacturing (CAM) system in the form of instruction for fabricating the synthesized logic design.

Each of the model instances has associated with it a number of "parameters," which describe such aspects of the model instance as signal timing, pinout, and technology type such as TTL. Each parameter of a model instance has a parameter value for that instance. For example, both a first model instance and a second model instance may have a parameter A, describing signal timing. The parameter of the first model instance may have a parameter A value of 10 microseconds, however, while the parameter of the second model instance has a parameter A value of 5 microseconds.

SUMMARY OF THE INVENTION

The present invention overcomes the problems and disadvantages of the prior art by defining circuit simplification rules that are applied when a sufficiently large benefit will result from application of the rule. Some of these rules recursively call themselves. Others of these rules search for and apply additional rules to other model instances.

Advantages of the invention will be set forth in part in the description which follows and, in part, will be obvious from the description or may be learned by practice of the invention. The advantages of the invention will be realized and attained by means of the elements and combinations particularly pointed out in the appended claims.

In accordance with the purpose of the invention, as embodied and broadly described herein, the circuit design synthesizing process of this invention relates to the replacement of a set of model instances currently representing the circuit design with a new set of model instances representing specific logic components of the circuit design in a data base and the alteration of attribute values associated with objects in the data base by application of selected ones of a set of rules to associated ones of the current model instances, each of the rules including an antecedent portion that evaluates to one of TRUE and FALSE and including a consequence portion indicating an action, the antecedent portion comprising at least one test. The process comprises the steps of initializing a benefit variable to a predetermined threshold value representing a benefit that must be achieved by application of a rule, and testing an antecedent portion of a rule in the set of rules, the antecedent portion including a plurality of subportions including a benefit variable subportion, by performing a series of substeps contained in the benefit variable subportion of the antecedent portion of the rule. The series of substeps include determining a benefit value representing a benefit that is achieved by application of the rule, and determining the benefit variable subportion to be TRUE when the determined benefit value is greater than the benefit variable. The process further comprises the steps of determining the antecedent portion to be TRUE when all subportions of the antecedent portion are TRUE, and applying the rule by performing the action indicated by the consequence portion of the rule when the antecedent portion is TRUE.

Further, in accordance with the purpose of the invention, as embodied and broadly described herein, the circuit design synthesizing process of this invention relates to the replacement of a set of model instances currently representing the circuit design with a new set of model instances representing specific logic components of the circuit design in a data base and the alteration of attribute values associated with objects in the data base by application of selected ones of a set of rules to associated ones of the current model instances, each of the rules including an antecedent portion that evaluates to one of TRUE and FALSE and including a consequence portion indicating an action, the antecedent portion comprising at least one test. The process comprises the steps of testing an antecedent portion of a rule in the set of rules, the rule being associated with a first current model instance; and performing a series of substeps contained in a consequence portion of the rule when the antecedent portion is TRUE. The substeps include indicating a second current model instance connected to the first current model instance, and applying a rule associated with the second current model instance to the second current model instance.

Further in accordance with the purpose of the invention as embodied and broadly described herein, the circuit synthesis process of the invention relates to the replacement of a set of model instances currently representing the circuit design with a new set of model instances representing specific logic components of the circuit design in a data base and the alteration of attribute values associated with objects in the data base by application of selected ones of a set of rules to associated ones of the current model instances, each of the rules including an antecedent portion that evaluates to one of TRUE and FALSE and including a consequence portion indicating an action, the antecedent portion comprising at least one test. The process comprises the steps of testing an antecedent portion of a rule in the set of rules, the rule associated with a current model instance; and performing a series of substeps contained in a consequence portion of the rule when the antecedent portion is TRUE. The substeps include replacing the current model instance with a simpler new current model instance, and applying a rule associated with the new current model instance to the new current model instance.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 9 is a table showing instance-rule pairs and SIZEWIN groupings generated according to the method of FIG. 6; and FIG. 10 shows a first rule base and a second rule base of a preferred embodiment of the present invention;

FIG. 11(a) is a flow chart showing a method of a preferred embodiment of the present invention;

FIG. 11(b) is a flow chart showing a method of another preferred embodiment of the present invention;

FIG. 12 shows a rule in the first rule base of FIG. 10;

FIG. 13 is a flow chart of a portion of the rule of FIG. 12;

FIG. 14 shows another rule in the rule base of FIG. 10;

FIG. 15 is a flow chart of a portion of the rule base of FIG. 14;

FIG. 16 shows a rule in the second rule base of FIG. 10;

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
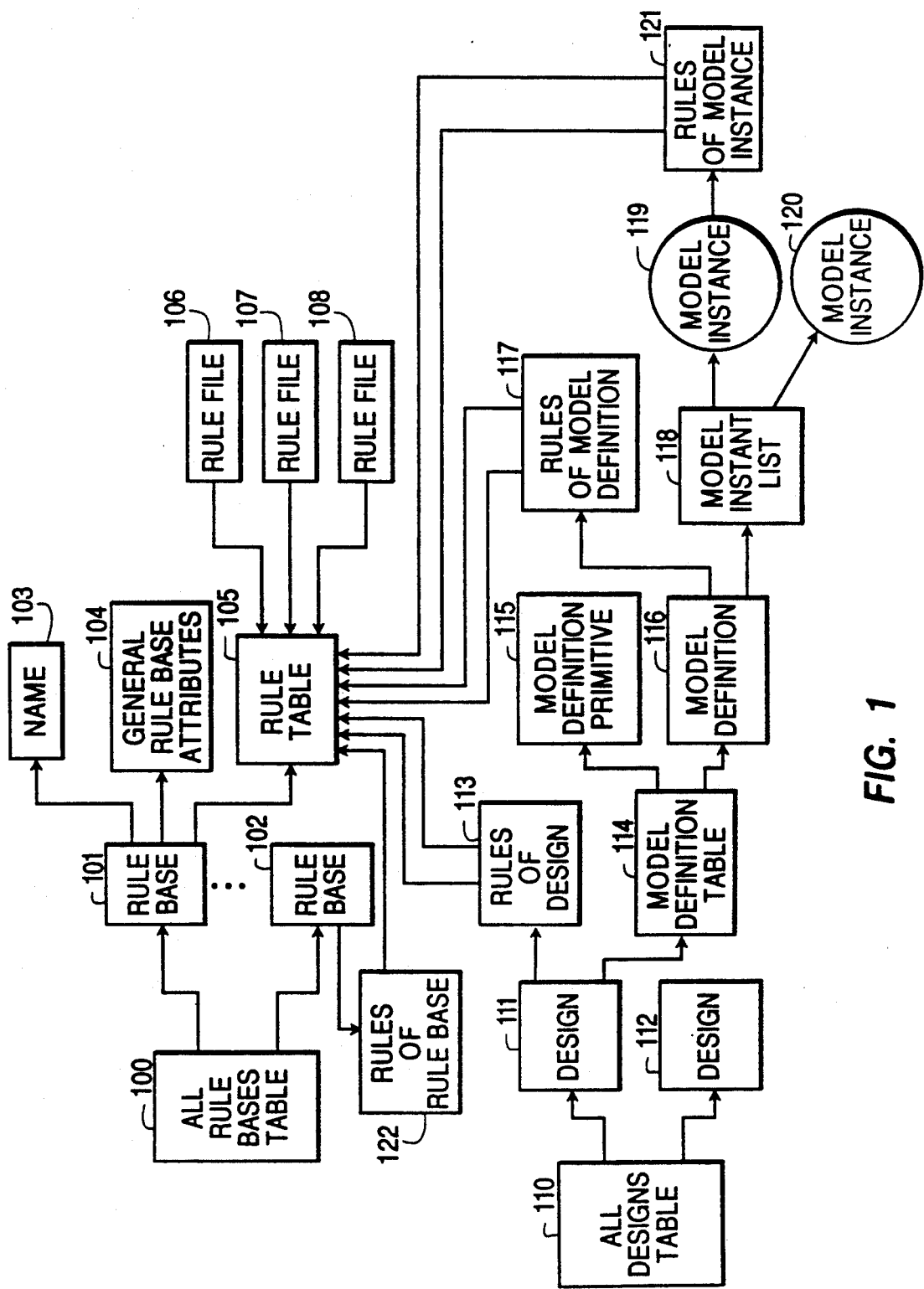
FIG. 1 is an overview of a data base format.

FIG. 1 shows an overview of the data base described in the above-referenced U.S. application Ser. No. 06/907,303. An all rule bases table 100 points to various groups of rules, referred to as rule bases 101 and 102. Each rule base 101 and 102 has an associated name 103 and general rule base attributes 104, as described below. Each rule base 101 and 102 also contains a pointer to a rule table 105, which contains pointers to rules currently being considered for application to the model instances. Each rule base 101 and 102 also points to a rules of rule base table 122, which indicates general design rules applicable to that rule base.

Rules are contained in rule files 106, 107, and 108. The rule table 105 contains pointers to the rules in the rule files, instead of containing the actual rules. The rule table 105 is itself pointed to by the rules of rule base table 122, a rules of design table 113, and at least one rules of model definition table 117. Rules of rule base table 122 indicates general purpose rules that may apply to any model instance and to any design with which the rule base 101, 102 pointing to rules of rule base table 122 is intended for use. Rules of design table 113 indicates rules that may apply to any model instance, i.e. general design rules applicable throughout the system. The rules of model definition table 117 indicates rules that are to be applied to a specific model definition. The rules of model instance table 121 indicates rules that are to be applied to a specific model instance.

An all designs table 110 points to design information 111 and 112 for various logic designs to be synthesized by the system. Each design information 111 and 112 points to a model definition table, which indicates all the current model definitions available for that logic design and a rules of design table 113.

Model definitions may be of two types. A model definition primitive 115 is a low level component with no model instances, such as an inventor. A model definition 116 is a more abstract higher level component, such as an ALU (Arithmetic Logic Unit), etc., which may have one or more model instances meeting the general requirements of the model definition, and having a more detailed description of the model definition. Each model definition 116 contains a pointer to a rules of model definition table 117 and a model instance list 118. The model instance list 118 points to all model instances in the current logic design that fit the generic description of the model definition 116. For example, a model definition for an inverter may have mode instances representing a CMOS inverter, a TTL inverter, etc. In addition, some model instances 122 have rules associated only with that specific model instance. These rules are accessed through a rules of model instance table 121 accessible by the model instance 122.

During the circuit synthesis process, a rule to be associated with each model instance is chosen from rules of model instance table 121 if possible. If no applicable rule is found in rules of model instance table 121, the tables are searched in the following order until an applicable rule is found: rules of model definitions table 117, rules of design 113, rules of rule base 122.

Figure 2:
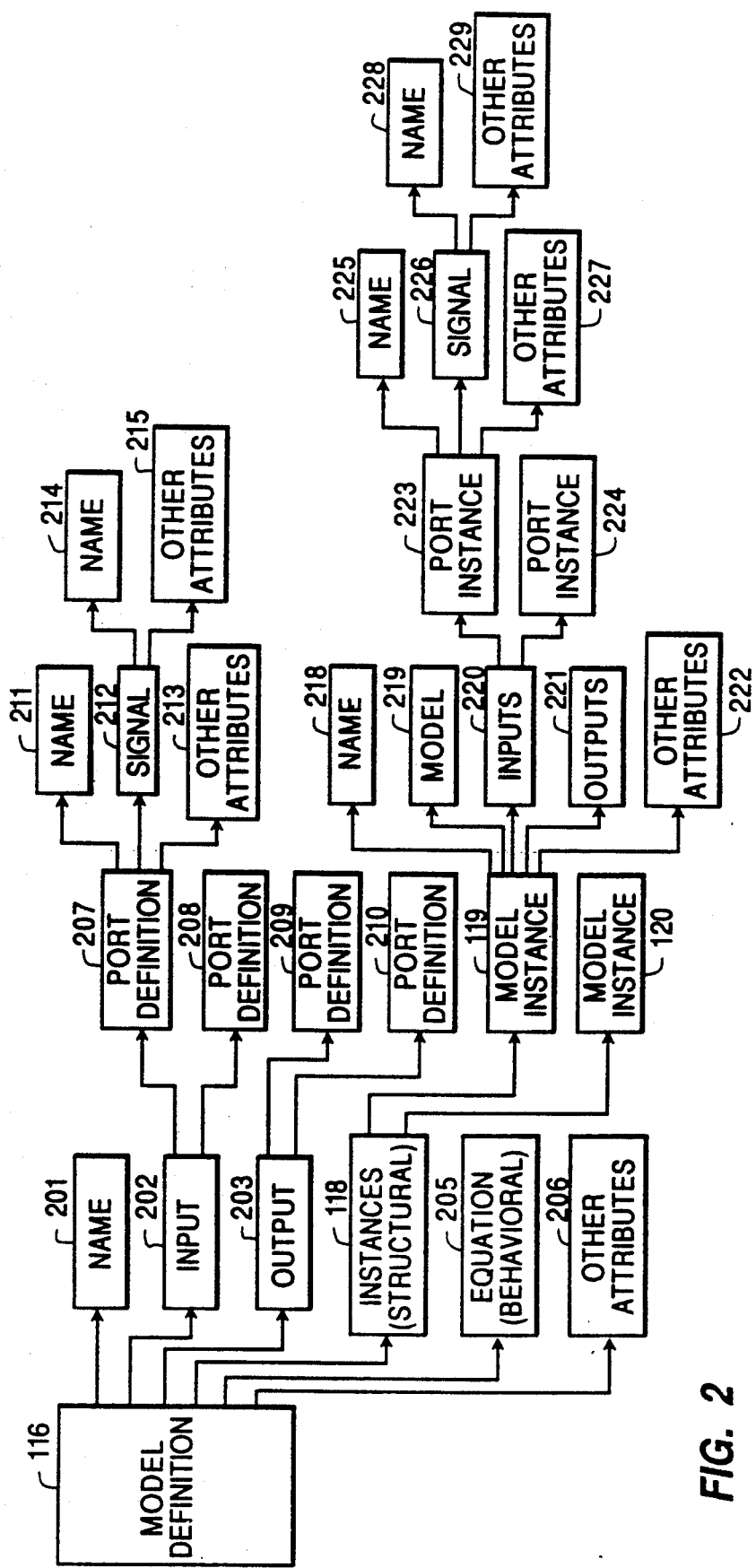
FIG. 2 is an expanded format for a model definition of FIG. 1.

FIG. 2 shows an expanded version of model definition 116 and the information associated therewith in the data base. FIG. 2 is included herein for informational purposes and does not purport to show physical connections within the logic circuit synthesis data base. Each model definition 116 has a name 201, a list of inputs 202, and a list of outputs 203. As described above, each model definition 116 has associated model instances, for example model instances 119 and 120, here pointed to by a model instances list 118. In addition, some model definitions 116 have associated behavioral equations 205, which function as an alternate more compact description of the logic function and connectivity of the model definition. One example of a behavioral equation is the equation format of the rules. Lastly, each model definition 116 has other associated attributes 206, which will not be discussed here and are not required for an understanding of the present invention.

List of inputs 202 and list of outputs 203 point to port definitions 207 and 208 and to port definitions 209 and 210, respectively. Port definitions 207-210 define the inputs and outputs of the specific model definition. Each port definition 207-210 has an associated name 211, signal 212, and other attributes 213 not described here. Each signal 212 describes the connectivity between two or more model definition in the circuit and has an associated name 214 and other attributes 215, such as the signal width or the value of the most significant bit of the signal.

Each model instance 119 and 120 has an associated name 218, a pointer 219 back to the model definition 116 with which the model instance is associated, inputs 220, outputs 221, and other attributes 222. Inputs 220 and outputs 221 have associated information describing associated port instances 223 and 224. Each port instance 223 and 224 describes an instance of one of port definitions 207 or 208 and has an associated name 225, an associated signal 226, and other attributes 227, such as printout. Signal 226 describes connectivity between two or more model instances in the circuit and has an associated name 228 and other attributes 229, such as timing constraints.

The attributes of model definitions, model instances, port definitions, port instances, inputs, outputs and signals are also called "parameters." Different model instances, for example, may have different parameter associated therewith. In addition, model instances having the same parameters may have different values for these parameters.

Figure 3:
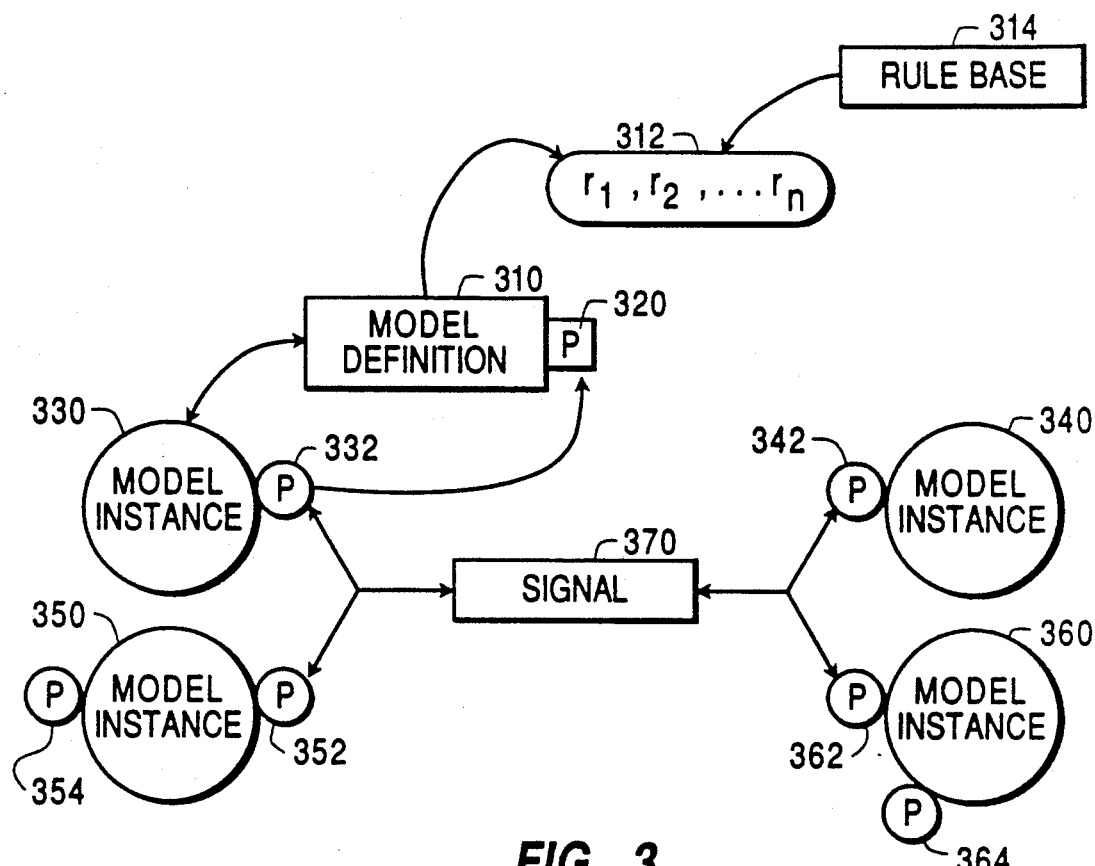
FIG. 3 shows an example of connectivity between model instances in the data base of FIG. 1.

FIG. 3 shows an example of the bidirectional pointers established between model definitions and model instances in the data base. This relationship called "connectivity." In FIG. 3, model definitions are shown as large rectangles. Model instances and port instances are shown as circles. Other components are shown as small rectangles. Model definition 310 and model instance 330 point to respective rules 312 of rule base 314. Model definition 310 also points to port definition 320 and to model instance 330. A port instance 322 connected to model instance 330 points to port definition 320. Model instance 330 is connected to model instances 340, 350, and 360 through port instance 332 and signal 370 and through respective port instances 342, 352, and 362. Port instances 354 and 364 are unused in this example.

Figure 4:
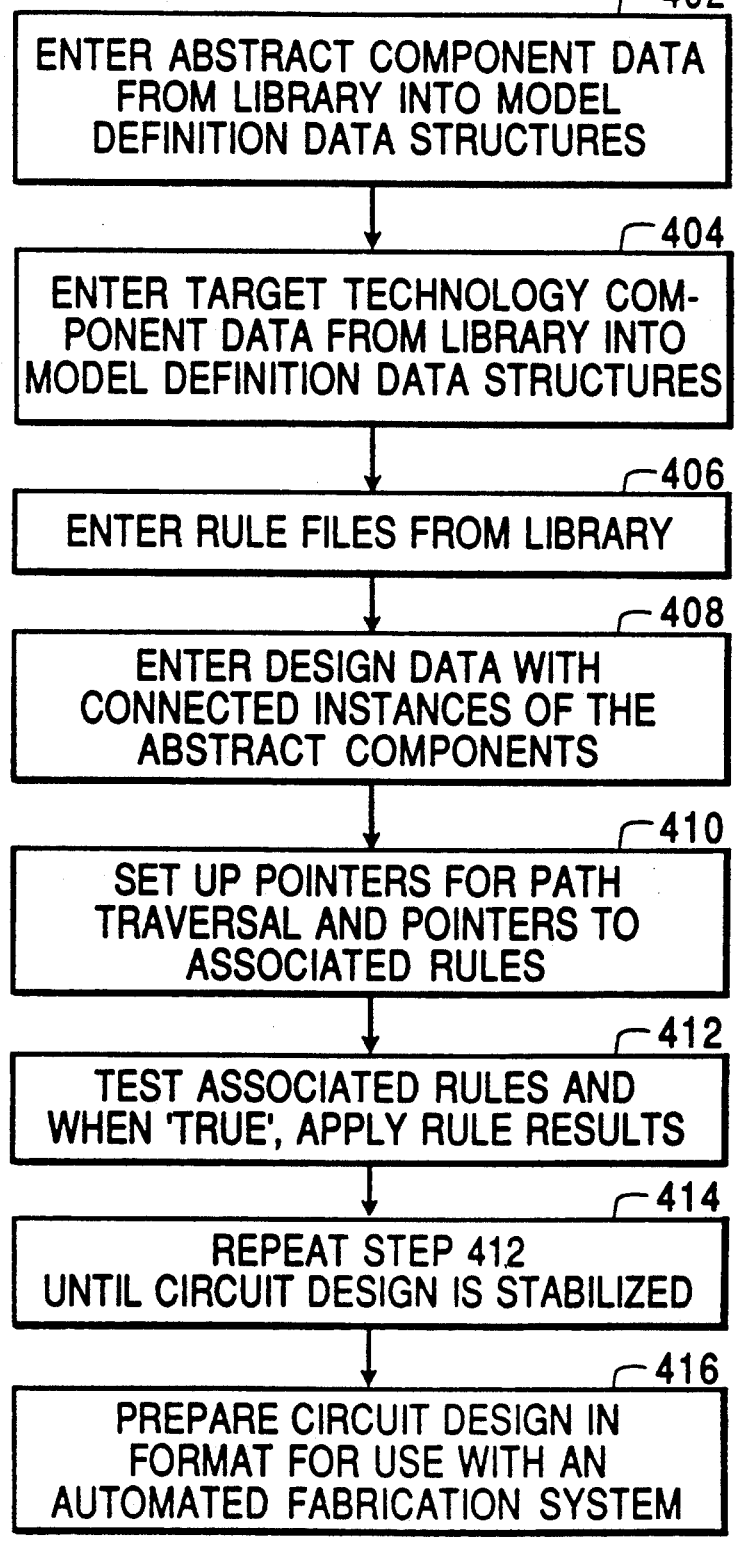
FIG. 4 is a flow chart of a method used to synthesize logic circuit designs using the data base of FIG. 1.

FIG. 4 is a flow chart 400 of the method used to synthesize logic design circuits using the above-described data base. This method is disclosed in the above-referenced U.S. Application Ser. No. 06/907,303 First, data is entered into the model definition data structures in steps 402 and 404. Data is also entered into the rule table at this time at step 406. Then the high-level abstraction of the design to be synthesized, i.e., the initial model instances are entered in step 408. Connectivity, i.e., pointers, between the various model instances and rules is established with a "pointification" process in step 410. Next, in steps 412 and 414, the rules associated with the model definitions of the current model instances are tested and applied when "TRUE" until the logic circuit design is stabilized. Lastly, in step 416, the stabilized circuit design is output in a format suitable for controlling a CAM system.

In the loop formed of steps 412 and 414, an associated rule is applied to each of the model instances in turn until a rule has been applied to each model instance. The process of applying a rule to each model instance in turn is called a "pass." Several existing methods for determining which associated rule to apply to a model instance are described below.

Figure 5:
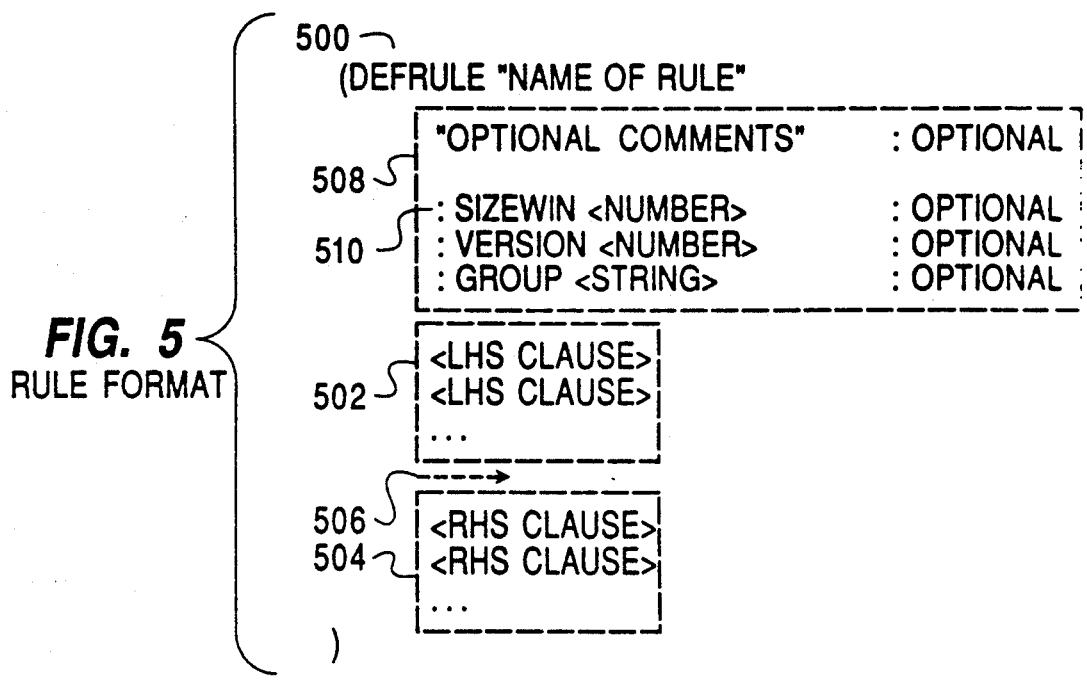
FIG. 5 is a format of a rule of the data base of FIG. 1.

FIG. 5 is a diagram showing the format of a rule 500 in the data base. The format of rule 500 is similar to formats used in the LISP computer languages and is shown in more detail in the above-referenced U.S application Ser. No. 06/907,512.

Each rule 500 includes a lefthand side (lhs) or antecedent portion 502 and a righthand side (rhs) or consequence portion 504. Antecedent portion 502 contains one or more test conditions that must all be TRUE before the rule is applied. Consequence portion 504 contains one or more actions to be performed during application of the rule if antecedent portion 502 is TRUE. An arrow 506 composed of three ASCII characters separates antecedent portion 502 from consequence portion 504.

Rule 500 may also contain optional information 508 such as, for example, a SIZEWIN value 510. SIZEWIN value 510 is used to specify the desirability of applying rule 500 and usually represents a number of model instances deleted or replaced by the rule. Alternately, SIZEWIN value 510 may be set to a predetermined number.

One action performed during application of a rule 500 is to replace one or more model instance with other model instances. For example, a rule "map 2-input OR" that replaces a single model instance has the format of FIG. 5 and appears as follows:

```
(defrule "map 2-input OR"
        "replace any 2-input OR with TECHCELL"
        :sizewin 2
        :version 0
        :group "mapping rules"
        (model is OR)
        (count-ins is 2)
        - >
        (replace *instance* with out = (TECHCELL ins))
)
```

In the above example, the rule is named "map 2-input OR". The function of the rule is to replace any "2-input OR" model instance with a model instance that, in this example, is named "TECHCELL". The rule has been assigned a SIZEWIN value of "2." If the SIZEWIN value had not been specified, the rule would have had a SIZEWIN value of "1" because one model instance is replaced by the rule. The version number, "0," has no effect upon the rule operation. Rule "map 2-input OR" belongs to a rule group "mapping rules." Antecedent portion 502 contains two test conditions: (1) the model instance with which the rule is associated must be an OR model instance and (2) the model instance with which the rule is associated must have exactly two inputs. Consequence portion 504 specifies that the model instance, "*instance*", with which the rule is associated should be replaced with a "TECHCELL" model instance.

Another action performed during application of a rule 500 is to remove one or more model instances. For example, a rule "take out" that removes a single model instance has the format of FIG. 5 and appears as follows:

```
(defrule "take out"
    (no signals-of-outputs are present)
    -->
    (remove *instance*)
)
```

Rule "take out" contains an antecedent test that evaluates whether the current model instance with which it is associated has any outputs. When the antecedent test evaluates to "TRUE," the consequence portion of the rule will be applied. Therefore, the rule removes the model instance with which it is associated when the model instance has no outputs.

Another action performed during application of a rule 500 is to change the values of one or more of other attributes 222, 227, or 229 associated with a model instance. For example, a rule "modify_syn.hi" that has the format of FIG. 5 and appears as follows:

```
(defrule "modify syn.hi"
    "modify the value of the syn.hi parameter to convert
    output pin to high"
    :version 0
    (syn.hi_drive-1st-out is not_present)
    (timingdebt-1st-out > 0)
    -->
    (modify syn.hi_drive-1st-out with TRUE)
)
```

Rule "modify syn.hi" determines whether a parameter, i.e., an attribute, named "syn.hi" of a first output of the current model instance is not set to a high value, and if the timing of the circuit design so far is over allowable propagation delay. If so, the parameter "syn.hi" of the first output of the current model instance is set to a value of TRUE. In a preferred embodiment of the present invention, this parameter value setting is achieved by execution of a SETF function of the LISP programming language.

Because not all rules associated with a model instances evaluate to "TRUE" in the preferred embodiment, a rule is tested before being applied to a model instance, and only one rule that applies to a given model instance is actually applied during a given pass through a set of model instances.

In the present invention, model instances in the logic circuit data base are designated as VISIBLE/INVISIBLE, NEW/INACTIVE, and DELETED/non-DELETED. It is occasionally desirable to synthesize only a portion of a desired circuit. For example, a user may wish to create several different technology representations of a small portion of a single circuit. In this case, because the synthesis procedure must be performed several times, it is advantageous to "localize" a desired portion of the high-level description and to perform the synthesis procedure only for that portion. Model instances are designated as VISIBLE by a user if the model instances are included in a portion of the circuit to be synthesized that the user wishes to localize. The VISIBLE/INVISIBLE designation of a model instance will not change throughout the synthesis procedure. A model instance replacing a VISIBLE model instance will be VISIBLE.

All model instances are initially designated as NEW. When no applicable rule is found for a model instance, that model instance becomes INACTIVE and is not made NEW again until one of its neighboring model instances has a rule applied thereto.

All model instances are initially designated as non-DELETED. A model instance is designated as DELETED when application of a rule removes it from the data base, as described above. Rules affecting DELETED model instances evaluate to FALSE. Rules associated with DELETED model instances evaluate to FALSE.

All INVISIBLE model instances are INACTIVE. An INVISIBLE model instance can be deleted by application of a rule associated with some other model instance.

In accordance with the present invention, all rules in the data base have an associated SIZEWIN value. This SIZEWIN value is a figure of merit indicating the relative benefit of applying the rule and usually represents a number of model instances removed or replaced by an application of the rule. For example, the rule "take out" described above replaces one model instance and, therefore, would have a default SIZEWIN value of "1." Alternately, as described above, the user can specify a predetermined SIZEWIN for the rule when the rule is defined. The above-referenced U.S. application Ser. No. 06/907,303 discloses a SIZEWIN field. However, the SIZEWIN field of the above-referenced application is not used as described below for the present invention.

Figure 6:
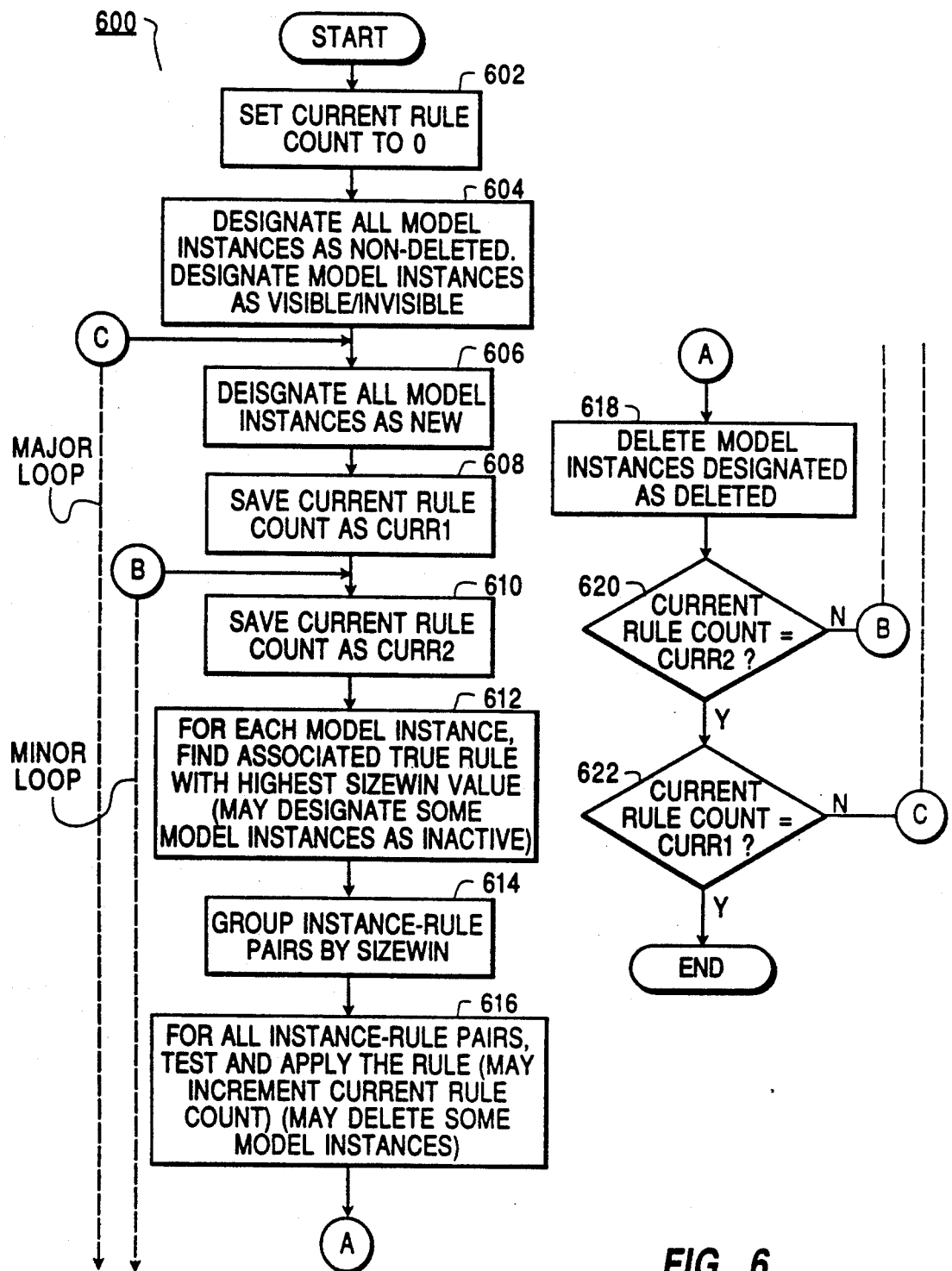
FIG. 6 is a flow chart of a method of selecting and applying rules to model instances according to a preferred embodiment of the present invention.

FIG. 6 is a flow chart 600 of a method of selecting and applying rules to model instances according to a preferred embodiment of the present invention. Flow chart 600 contains a major loop and a minor loop. One iteration of the minor loop corresponds to one pass through all the current model instances. The major loop is exited when the circuit design is stabilized.

In step 602, a current rule count is set to zero. The current rule count represents a total number of rules applied during the logic synthesis procedure. In step 604, all the model instances are designated as non-DELETED and various model instances are designated as VISIBLE or INVISIBLE, depending on which areas of the logic circuit the user wishes to localize. In step 606, all model instances are designated as NEW. In step 608, the current rule count is saved as CURR1. In step 610, the current rule count is saved as CURR2. In step 612, model instance-rule pairs (hereinafter instance-rule pairs) for one iteration of the minor loop are determined. Each model instance is paired with an associated rule that evaluates to TRUE and that has a highest SIZEWIN value of all TRUE rules associated with that model instance. Step 612 is discussed further in connection with FIG. 7 below. In step 614, the instance-rule pairs are grouped by SIZEWIN value. In step 616, the instance-rule pairs are tested and applied in order according to their SIZEWIN groupings, with the highest SIZEWIN rules being tested first. During step 616, if a model instance is deleted by application of a rule, the model instance is marked as DELETED, but is not removed from the data base. Model instances marked as DELETED are not actually deleted from the data base until after step 616 is completed, in step 618. Step 616 is discussed further in connection with FIG. 8 below.

Step 620 determines whether the rule count stayed the same during the most recent iteration of the minor loop. If not, i.e., if a rule was applied, control passes to step 610. Otherwise control passes to step 622. Step 622 determines whether the rule count stayed the same during the most recent iteration of the major loop. If not, i.e., if a rule was applied, control passes to step 606. Otherwise the circuit design is considered to be stabilized and processing is ended.

Figure 7:
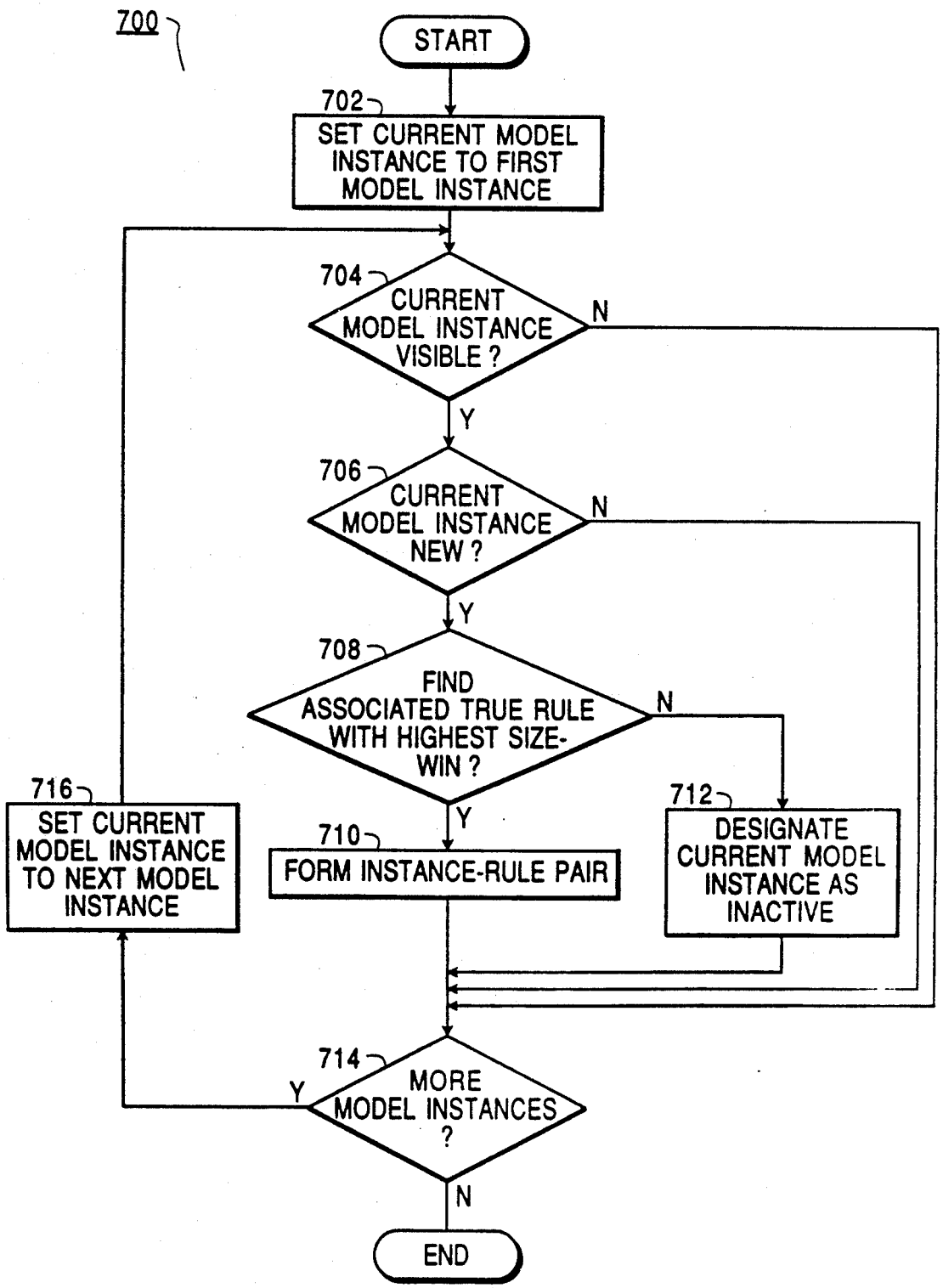
FIG. 7 is a flow chart further describing the method of selecting rules of FIG. 6.

FIG. 7 is a flow chart 700 showing step 604 of FIG. 6 in more detail. Thus, FIG. 7 shows how the instance-rule pairs for one iteration of the minor loop of FIG. 6 are determined in accordance with a preferred embodiment of the present invention. Each model instance is paired with its associated rule that evaluates to TRUE and that has the highest SIZEWIN value of all the TRUE rules associated with that model instance.

Step 702 establishes a first model instance as the "current model instance." Step 704 determines if the current model instance has been designated as VISIBLE. If so, control passes to step 706. If not, control passes to step 714. Step 706 determines if the current model instance has been designated as NEW. If so, control passes to step 708. If not, control passes to step 714. Step 708 determines whether the current model instance has at least one associated rule that evaluates to TRUE. If more than one such rule exists, step 708 selects the associated TRUE rule with the highest SIZEWIN value and control passes to step 710 where the current model instance and the selected rule are placed in a instance-rule pair. If no associated TRUE rules exist for the current model instance in step 708, control passes to step 712. In step 712, the current model instance is designated as INACTIVE. This step is not performed for logic synthesis systems not designating model instances as NEW/INACTIVE. Step 714 determines whether more model instances still need to be paired. If so, a new current model instance is selected in step 716 and control returns to step 704. If not, the steps of FIG. 7 are completed.

The invention includes means for testing an antecedent portion of a rule and means for determining the antecedent portion to be TRUE when all subportions of the antecedent portion are TRUE. This means is preferably embodied in a central processor 2202 of FIG. 22, which performs at least step 804 of FIG. 8.

Figure 8:
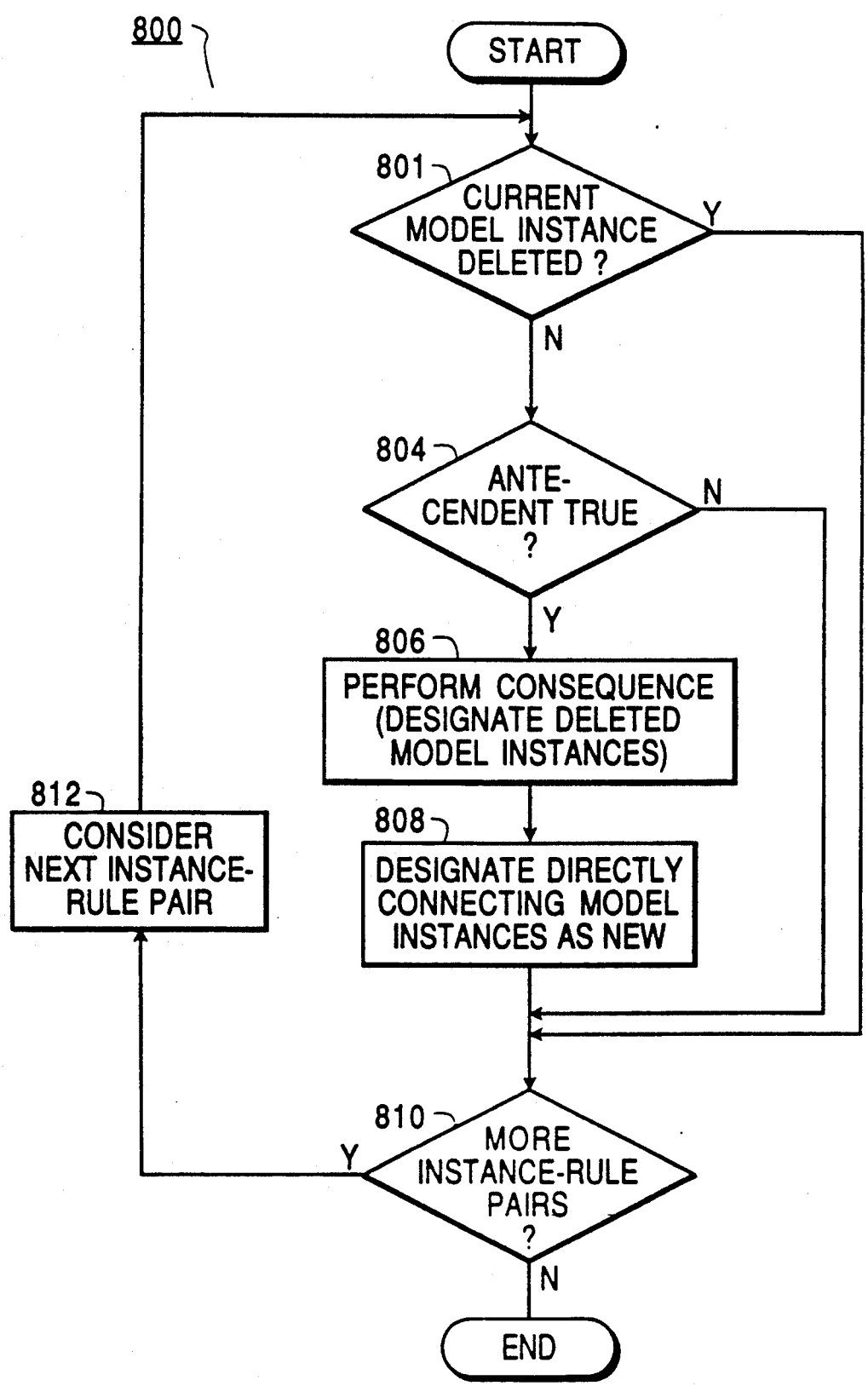
FIG. 8 is a flow chart further describing the method applying rules of FIG. 6.

FIG. 8 is a flow chart 800 further describing step 616 of FIG. 6. Thus, FIG. 8 describes the steps performed in accordance with the present invention to test and apply each rule of the instance-rule pairs. The instance-rule pair being tested is called the current pair. A rule of the current pair is called the current rule. A model instance of the current pair is called the current model instance.

Step 801 determines whether the current model instance has been designated as DELETED. If so, control passes to step 810, Otherwise, control passes to step 804. Step 804 determines whether the antecedent portion of the current rule is TRUE. Although step 708 of FIG. 7 determined that the current rule was TRUE when the current pair was created, subsequent applications of other rules may have caused the current rule to become false. If the antecedent portion of the current rule is TRUE, the consequence portion of the current rule is performed in step 806. If the antecedent portion of the current rule is false, control passes to step 810.

Step 808 designates the current model instance and all model instances connected to the current model instance in the circuit as NEW. Step 810 determines if more instance-rule pairs exist. If so, control returns to step 801. Otherwise, processing for FIG. 8 is completed.

The invention includes means for applying the rule by performing an action indicated by a consequence portion when the antecedent portion is TRUE. This means is preferably embodied in central processor 2202 of FIG. 22, which performs at least step 806 of FIG. 8.

FIG. 9 is a table showing an example of instance-rule pairs and SIZEWIN groupings. A data base contains model instances $i_1$ through $i_8$. Model instance $i_1$ has associated rules $r_1$, $r_5$, and $r_7$. Model instance $i_2$ has associated rules $r_2$ and $r_4$. Model instance $i_3$ has associated rule $r_3$. Model instance $i_4$ has associated rules $r_2$ and $r_4$. Model instance $i_5$ has associated rules $r_5$, $r_7$, and $r_8$. Model instance $i_6$ has associated rule $r_6$ Model instance $i_7$ has associated rule $r_7$. Model instance $i_8$ has associated rule $r_8$. In FIG. 9, the model instances $i_1$ through $i_8$ have between one and three associated rules apiece.

It is understood, however, that a model instance can have any number of associated rules. Similarly, FIG. 9 shows eight model instances $i_1$ through $i_8$ and eight rules $r_1$ through $r_8$. It is understood, however, that the data base can contain as many model instances and as many rules as it has capacity to hold. The number of model instances and rules need not be the same.

In FIG. 9, the number in parenthesis to the right of each rule is the SIZEWIN value for that rule. Most commonly, the SIZEWIN value represents a number of model instances replaced by application of the rule. However, as discussed above, the SIZEWIN value for a rule can also be set to a predetermined value when the rule is defined. In FIG. 9, rule $r_1$ has a SIZEWIN value of "5". Rule $r_2$ has a SIZEWIN value of "3". Rule $r_3$ has a SIZEWIN value of "5". Rule $r_4$ has a SIZEWIN value of "2". Rule $r_5$ has a SIZEWIN value of "2". Rule $r_6$ has a SIZEWIN value of "5". Rule $r_7$ has a SIZEWIN value of "1". Rule $r_8$ has a SIZEWIN value of "4". In FIG. 9, the SIZEWIN values of rules $r_1$ through $r_8$ range between "1" and "5". It is understood, however, that SIZEWIN values may fall in any range appropriate for a specific embodiment of the present invention. For example, a logic synthesis system according to the present invention and incorporating a large number of rules may have SIZEWIN values between "0" and "5". Similarly, a logic synthesis system according to the present invention and incorporating some medium number of rules may have a large number of possible SIZEWIN values if it is desirable to have only a few instance-rule pairs in each SIZEWIN grouping.

FIG. 9 also shows SIZEWIN groupings of instance-rule pairs of the model instances $i_1$ through $i_8$. For example, model instance $i_1$ is paired with its associated TRUE rule with the highest SIZEWIN value, i.e., $r_5$, which has a SIZEWIN of "2". Therefore, the instance-rule pair $i_1$, $r_5$ is placed in SIZEWIN grouping 2. Note that, although rule $r_5$ evaluates to TRUE for model instance $i_1$, it does not evaluate to TRUE for model instance $i_5$. This result is included to show that one rule may be evaluated differently depending on the characteristics of the model instance with which it is associated. Because model instance $i_5$ does not have any associated rules that evaluate to TRUE, model instance $i_5$ is not placed in a pair and is not placed in a SIZEWIN grouping. Note also that, in FIG. 9, no instance-rule pairs are placed in SIZEWIN grouping 0 because no pairs are formed containing a rule with a SIZEWIN value of "1."

FIG. 10 shows a first rule base 1002 and a second rule base 1004 of a preferred embodiment of the present invention. First rule base 1002 has two associated rule files: "Sum-of-Products Redundancy Removal" rule file 1006 and "Sum-of-Products Common Term Reduction" rule file 1008. Second rule base 1004 has an associated "Big-OR" rule file 1010. Both first rule base 1002 and second rule base 1004 may contain other rule files not discussed herein. First rule base 1002 is used during circuit synthesis when it is desirable to remove redundant components and common terms from a complex sum-of-products circuit. First rule base 1002 is discussed in relation to FIGS. 11–15. Second rule base 1004 is used during circuit synthesis to simplify a complex sum-of-products circuit. Second rule base 1004 is discussed in relation to FIGS. 16–17.

"Sum-of-Products Redundancy Removal" rule file 1006 includes a plurality of rules to remove redundant model instances from the logic synthesis data base. The theory of redundancy removal is well-understood by persons skilled in the art. Rule file 1006 may include, for example, rules exemplified by the following equations:

$$(a * b * x)+(a * b * y) \rightarrow (a * b * (x+y))$$

$$(a * b * x)+(a * b * -x) \rightarrow (a * b)$$

$$(a * b * c)+(-a * b) \rightarrow (b * c)+(-a * b)$$

The above equations are only a few examples of functions of rules in rule file 1006.

"Sum-of-Products Common Term Reduction" rule file 1008 includes a plurality of rules to remove common model instances from the logic synthesis data base. The theory of common term reduction is also well-understood by persons skilled in the art.

The invention includes means for initializing a benefit variable to a predetermined value. This means is preferably embodied in a central processor 1902 of FIG. 19, which performs at least step 1102 of FIG. 11.

FIGS. 11($a$) and 11($b$) are flow charts 1100 and 1101 showing alternate versions of an initialization step for a "benefit variable" that is performed before the beginning of the minor loop of FIG. 6. One of the flow charts 1100 and 1101 is performed when the logic synthesis process is using rules from rule file 1002 because rules in these rule bases use the benefit variable.

Flow chart 1100 contains steps 1102 and 1104 performed in a first embodiment of the present invention and flow chart 1101 contains steps 1103 and 1105 performed in a second embodiment of the present invention. Both steps 1102 and 1103 initialize a "benefit variable" stored in memory to a predetermined value. The benefit variable represents different types of data, in different embodiments of the present invention. In one preferred embodiment of the invention, the benefit variable is also called the "temperature-of-technology variable." This name derives from an analogy made by the inventors between the logic synthesis process and the process of annealing metals, in which a certain temperature must be attained for annealing to occur. In the logic synthesis process according to the present invention, a certain minimum benefit, e.g., a certain minimum savings of timing or pinout, represented by the temperature-of-technology variable, must result before a rule is applied to the model instances in the data base. Throughout the remainder of the specification, the term "benefit variable" will be used.

The method of flow charts 1100 and 1101, initializing the benefit variable, are performed when the logic synthesis system is using rule base 1002 or rule base 1004., i.e., when the logic synthesis system is reducing common model instances in the data base or removing redundant model instances from the data base.

In flow chart 1100, the benefit variable represents a minimum acceptable savings of timing that must be achieved before a rule can be applied. In a preferred embodiment of the present invention, for example, the benefit variable is initialized to 4000 picoseconds. In flow chart 1101, the benefit variable represents a minimum acceptable number of pins that must be removed by a rule before that rule is applied. In a preferred embodiment of the present invention, for example, the benefit variable is initialized to a number between 10 and 20 pins for use with rule base 1004.

It will be apparent to persons skilled in the art that the benefit variable can also be used to represent other minimum acceptable values in a circuit synthesis system and that the benefit variable can also be used to represent maximum acceptable values. Not all rules in rule bases 1002 and 1004 use the benefit variable initialized in FIGS. 11($a$) and 11($b$), but rules in either rule base may use either version of the benefit variable as described below.

Step 1104 of flow chart 1100 and step 1105 of flow chart 1101 are located at the bottom of the minor loop of FIG. 6. Steps 1104 and 1105 decrement the benefit variable. Different preferred embodiments of the present invention use different methods of decrementing the benefit variable. A first preferred embodiment decreases the benefit variable by a predetermined constant. A second preferred embodiment decreases the benefit variable by a value that increases exponentially with each iteration of the minor loop. A third preferred embodiment decreases the benefit variable by a value that varies in accordance with a number of rules applied during a most recent iteration of the minor loop.

It will be apparent to persons skilled in the art that, if the benefit variable is a maximum value instead of a minimum value, the benefit variable will be incremented instead of decremented after each iteration of the minor loop.

FIG. 12 shows an example of a rule 1200 in "Sum-of-Products Redundancy Removal" rule file 1006. Rule 1200 is an example of a rule using the benefit variable to represent a minimum acceptable number of pins to be removed by the rule. Rule 1200 contains a title 1206, comments 1208 (numbered only once), a SIZEWIN indicator 1210, an antecedent portion 1202, and a consequence portion 1204. Antecedent portion 1202 contains test condition 1212, which calculates a benefit value in calculation 1214 representing the number of pins removed by rule 1200 and which compares the calculated benefit value to the benefit variable initialized in FIG. 11($b$). Test condition 1212 is described below. Although rule 1200 is written using the rule grammar disclosed in the above-referenced U.S application Ser. No. 06/907,512, persons skilled in the art will understand that equivalent systems may include rules specified with different syntax, yet performing equivalent functions.

The invention includes means for determining, according to an antecedent portion of a rule, a benefit value achieved by the rule. This means is preferably embodied in central processor 1902 of FIG. 19, which performs at least step 1302 of FIG. 13 or step 1502 of FIG. 15.

The invention includes means for determining, according to an antecedent portion of a rule, a benefit variable subportion of the rule to be TRUE when the determined benefit value is greater than the benefit variable. This means is preferably embodied in central processor 1902 of FIG. 19, which performs at least step 1304 of FIG. 13 or step 1504 of FIG. 15.

FIG. 13 is a flow chart 1300 of the method of test condition 1212, including calculation 1214. Flow chart 1300 is also an expansion of step 616 of FIG. 6. In step 1302 a benefit value is calculated according to the equation:

$$bv = (m-1)n,$$

where
bv is a benefit value,
m is a number of model instances currently in the data base, and
n is a number of common model instances currently in the data base.

Thus, in rule 1200, the calculated benefit value represents a pin savings that will result if the consequence portion of rule 1200 is performed. Step 1304 corresponds to the comparison of test condition 1212. In step 1304 the current value of the benefit variable is compared to the calculated benefit value and, if it is less than the calculated benefit value, step 1206 performs the consequence portion of the rule. It will be understood by persons skilled in the art that rule 1200 may contain other tests that must also be TRUE for consequence portion 1204 to be performed. Only test condition 1212 has been shown in flow chart 1300, however, for the sake of clarity.

FIG. 14 shows an example of a rule 1400 in "Sum-of-Products Common Term Reduction" rule file 1008. Rule 1400 is an example of a rule using the benefit variable to represent a minimum acceptable savings of timing that must be achieved by a rule for the rule to be executed. Rule 1400 contains a title 1406, comments 1408 (numbered only once), an antecedent portion 1402, and a consequence portion 1404. Antecedent portion 1402 contains a test condition 1412, which compares a benefit value representing a timing savings achieved by application of rule 1400 with the current value of the benefit variable initialized in FIG. 11(a). Test condition 1412 is described in more detail below. Although rule 1400 is written using the rule grammar disclosed in the above-referenced U.S. application Ser. No. 06/907,512, persons skilled in the art will understand that equivalent systems may include rules specified with different syntax, yet performing equivalent functions.

FIG. 15 is a flow chart 1500 of the method of test condition 1412 of rule 1400. Flow chart 1500 is also an expansion of step 616 of FIG. 6. In step 1502, a benefit value is determined. This benefit value represents a minimum acceptable timing savings that must be achieved by a rule. In rule 1400, the benefit value is determined by a separate portion of the logic synthesis process, such as another rule. In step 1504, the determined benefit value is compared to the current value of the benefit variable to determine whether the benefit value is greater than the benefit variable, i.e., whether the consequence portion of rule 1400 will result in at least the minimum acceptable timing savings represented by the benefit variable. If the determination in step 1504 is Yes, step 1506 performs the consequence portion of rule 1400.

It will be apparent to persons skilled in the art that the above rules are shown for exemplary purposes only, and do not constitute the only possible rules in rule base 1002. In addition, any rule in rule base 1002 can contain a benefit value calculation similar to the calculation shown in step 1302 of FIG. 13. Similarly, any rule in rule base 1002 could use a benefit value calculated by some other portion of the process, as described in connection with step 1502 of FIG. 15. Lastly, rules using a benefit value representing minimum acceptable timing savings or minimum acceptable pin savings could exist in rule bases other than that described above.

FIG. 16 shows an example of a rule 1600 in "Big-OR" rule file 1010. Rule 1600 contains a title 1606, comments 1608 (numbered only once), a SIZEWIN indicator 1610, an antecedent portion 1602, and a consequence portion 1604. Consequence portion 1604 includes statement 1612, 1614, 1616, 1618, and 1620. Statements 1612, 1614, 1616, 1618, and 1620 are discussed in more detail below. Although rule 1600 is written using the rule grammar disclosed in the above-referenced U.S. application Ser. No. 06/907,512, persons skilled in the art will understand that equivalent systems may include rules specified with different syntax, yet performing equivalent functions.

The function of rule 1600 is to "pull out" or isolate terms of a sum-of-products in the data base (hereinafter called a Big-OR design instance). The isolated terms correspond to predetermined groups of model instances called cells that can be utilized by a CAM system. Rule 1600 is specifically written to "pull out" or isolate a cell containing a five input AND gate, a four input AND gate, a three input AND gate, a two input AND gate, and a one input AND gate.

Figure 18:
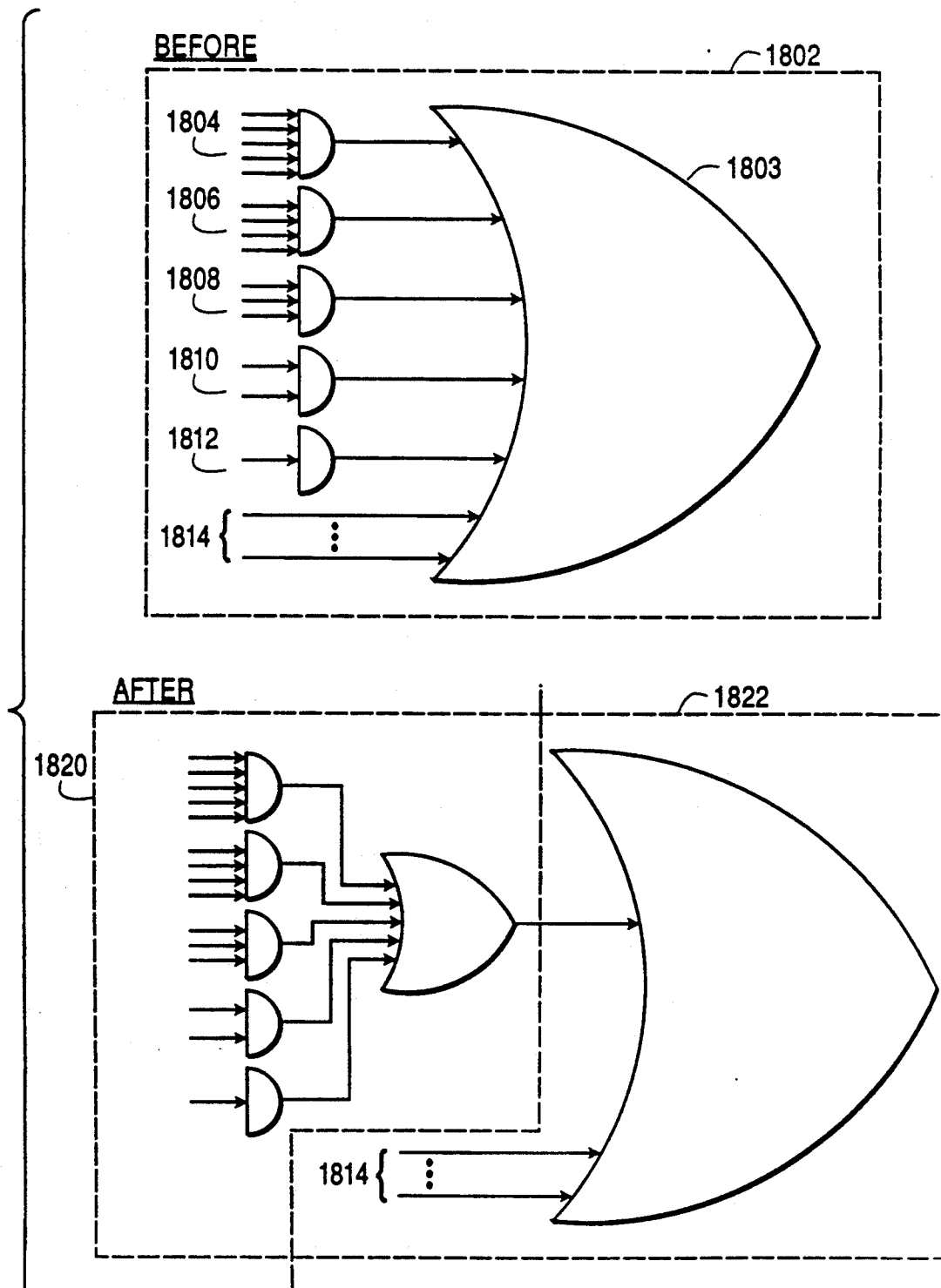
FIG. 18 is a logic circuit diagram of a model instance before and after application of the rule of FIG. 16.

FIG. 18 is a logic circuit diagram showing a Big-OR design instance before and after application of rule 1600. Before application of rule 1600, a Big-OR design instance 1802 includes an OR gate 1803, which receives inputs from a five input AND gate 1804, a four input AND gate 1806, a three input AND gate 1808, a two input AND gate 1810, a one input AND gate 1812, and other gates 1814 not shown in detail. After application of rule 1600 to Big-OR design instance 1802, Big-OR design instance 1802 is referred to as old Big-OR and a new model instance 1820 has been isolated from the old Big-OR design instance, resulting in a new Big-OR 1822, which no longer contains model instance 1820.

Figure 17:
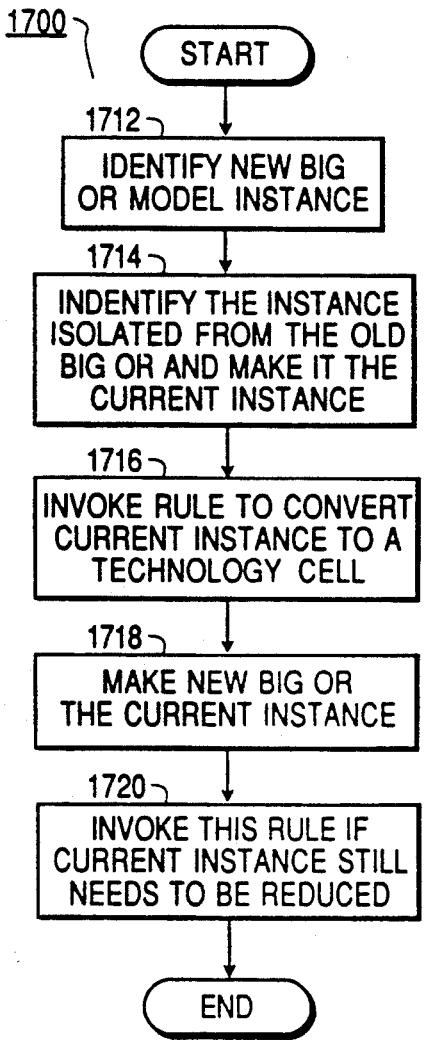
FIG. 17 is a flow chart of a portion of the rule base of FIG. 16.

Antecedent portion 1602 of rule 1600 determines whether the situation shown in the "before" diagram of FIG. 18 exists. If antecedent portion 1602 evaluates to TRUE, then the design instance 1820 is isolated from the old Big-OR 1802 and, further, the steps of FIG. 17 are performed by the consequence portion 1604.

The invention includes means for indicating, according to a first substep in a consequence portion of a rule, a second current model instance connected to a first current model instance. This means is preferably embodied in a central processor 1902 of FIG. 19, which performs at least steps 1712 and 1714 of FIG. 17.

The invention includes means for applying, according to a second substep in the consequence portion of the rule, a rule associated with the second current model instance to the second current model instance. This means preferably is embodied in processor 1902 of FIG. 19, which performs at least step 1716 of FIG. 17.

The invention includes means for replacing the current model instance with a simpler new current model instance, according to a first substep in the consequence portion of the rule. This means preferably is embodied in central processor 1902 of FIG. 19, which performs at least step 1718 of FIG. 17.

The invention includes means for applying a rule associated with the new current model instance to the new current model instance, according to a second substep in the consequence portion of the rule, and further includes means for recursively performing testing and performing steps for the new current model instance, according to a substep in the consequence portion of the rule. Both means are embodied in central processor 1902 of FIG. 19, which performs at least step 1720 of FIG. 17.

FIG. 17 is a partial flow chart 1700 of the method of consequence portion 1604. Flow chart 1700 is also an expansion of step 616 of FIG. 6. Steps 1712, 1714, 1716, 1718, and 1720 of flow chart 1700 correspond to statements 1612, 1614, 1616, 1618, and 1620 of rule 1600, respectively. In step 1712 a model instance of the new Big-OR is identified. In step 1714 the model instance isolated from the old Big-OR is made the current model instance. In step 1716 a rule is invoked to convert the current model instance, i.e., the instance isolated from the old Big-OR, to a predetermined technology. Although the described embodiment does not invoke the technology converting rule by name, the system of the embodiment is such that the converting rule will be invoked in statement 1616. Other preferred embodiments may invoke the converting rule explicitly. In step 1718 the new Big-OR is made the current model instance. In step 1720 the rule currently being executed is recursively invoked. Although the rule currently being executed is not specifically invoked by name, the system of the embodiment is such that a recursive invocation will occur in statement 1620. Other preferred embodiments may explicitly make a recursive call.

Statement 1630 of rule 1600 in FIG. 16 contains the condition "are_not_frozen." Other rules may include the condition "is not frozen" when only a single model instance is being tested. In a present preferred embodiment, certain inputs to the OR of the Big-OR model instance may be designated as FROZEN, either by the user prior to the beginning of the synthesis procedure or by application of a rule during the synthesis procedure. FROZEN inputs are not to be included in the isolated model instance. Thus, in embodiments where gates can be designated as FROZEN, rules will test whether a gate is "not frozen" before isolating it.

It will be apparent to persons skilled in the art that other Big-OR rules exist to isolate other predetermined model instances from sum-of-products circuits. Some of these other rules, for example, isolate "5-4-2-2-1" input AND gates, "5-3-3-2-1" input AND gates, "5-2-2-2-1" input AND gates, "4-4-2-2-1" input AND gates, 4-3-3-3-1"input AND gates, "4-3-3-2-1" AND gates, "4-3-2-2-1" AND gates, "4-2-2-2-1" input AND gates, "3-3-3-3-1" input AND gates, and "3-3-3-1" input AND gates. The above list is included for exemplary purposes and is not inclusive.

It will also be apparent to persons skilled in the art that the above examples may be applied to product-of-sums circuits by application of DeMorgan's law.

Figure 19:
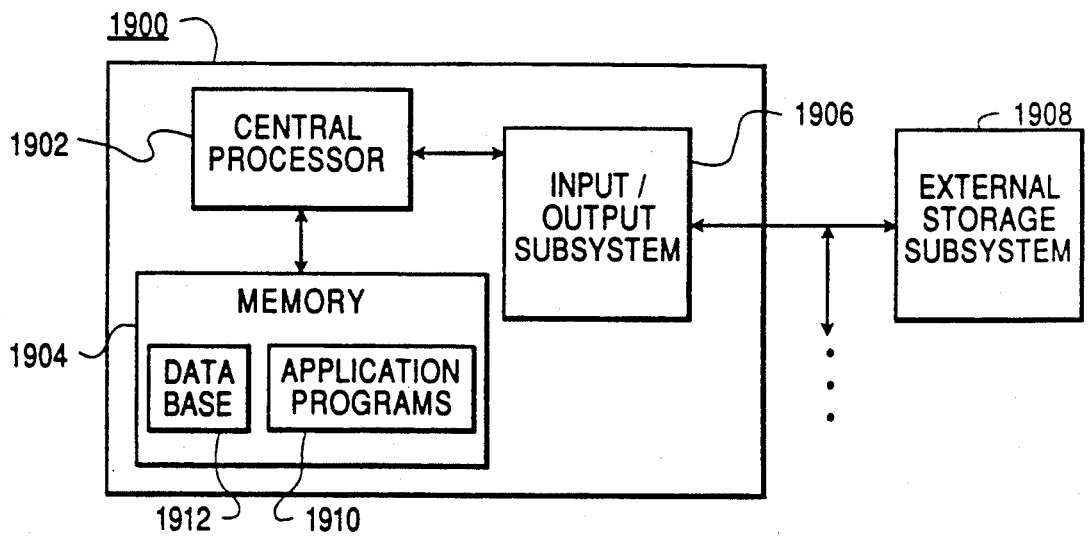
FIG. 19 is a block diagram of a computer system which constitutes a preferred embodiment of the present invention.

FIG. 19 shows a computer system 1900 which constitutes a preferred embodiment of the invention. System 1900 is a VAX 6850 system commercially available from the Digital Equipment Corporation. System 1900 includes a central process 1902, a memory 1904 connected to central processor 1902, an input/output (I/O) subsystem 1906 connected to central processor 1902, and an external storage subsystem 1908 connected to I/O subsystem 1906. The methods set forth in the flow charts of FIGS. 6-18 are identified as application programs 1910, which are written in the LISP computer language, stored in memory 1904, and performed by central processor 1902. Computer system 1900 preferably operates under the VMS operating system. Memory 1904 also stores the database 1912 of the present invention, including the model definitions, model instances, and rules for the current rule base. Central processor uses I/O subsystem 1906 to input data base entries and to output the final technology representation from memory 1904. Rules bases and LIBRARY data not used for a particular run of the logic synthesis system are stored offline in external storage subsystem 1908. It will be apparent to persons skilled in the art that other computer systems and components could be used.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A process of synthesizing a circuit design stored in a data processing system including a data base, by replacing a set of current model instances each model instance consisting of a representation of a portion of an electrical circuit currently representing the circuit design in the data base with a new set of model instances and by altering attribute values stored in the data base and associated with objects in the data base by application of selected ones of a set of rules stored in the data base to associated ones of the current model instances, each of the rules including an antecedent portion that evaluates to one of TRUE and FALSE and including a consequence portion indicating an action, the antecedent portion comprising at least one test, the process comprising the steps, performed by the data processing system, of:

initializing a benefit variable stored in the data base to a predetermined threshold value representing a benefit that must be achieved by application of a rule;

testing an antecedent portion of a rule in the set of rules, the antecedent portion including a plurality of subportions including a benefit variable subportion, by performing the following substeps contained in the benefit variable subportion of the antecedent portion of the rule:

determining a benefit value representing a benefit that is achieved by application of the rule, and determining the benefit variable subportion to be TRUE when the determined benefit value is greater than the benefit variable stored in the data base;

determining the antecedent portion to be TRUE when all subportions of the antecedent portion are TRUE; and applying the rule by performing the action indicated by the consequence portion of the rule on items in the data base when the antecedent portion is TRUE.

2. The process of claim 1, wherein the step of determining the benefit value further includes the step, performed by the data processing system, of:

calculating a benefit value stored in the memory that will result from application of the rule.

3. The process of claim 1, wherein the steps of testing and applying are repeated for each current model instance.

4. The process of claim 3, wherein the repeated steps of testing and applying are included in one iteration of a minor loop, and further including the step, performed by the data processing system, of altering the benefit variable stored in the data base after each iteration of the minor loop.

5. The process of claim 4, wherein the altering step further includes the step, performed by the data processing system, of decrementing the benefit variable stored in the data base by a predetermined constant.

6. The process of claim 4, wherein the altering step further includes the step, performed by the data processing system, of decrementing the benefit variable by a value that increases exponentially with each pass of the minor loop.

7. The process of claim 4, wherein the altering step further includes the step, performed by the data processing system, of decrementing the benefit variable stored in the data base by a value that varies in accordance with a number of applying steps performed during a most recent iteration of the minor loop.

8. The process of claim 1, wherein the current model instances possess a current number of input and output pins, wherein replacing the set of current model instances with a new set of model instances results in a change in the total number of pins, and wherein the initializing step further includes the step, performing by the data processing system, of initializing the benefit variable stored in the data base to a predetermined value representing a minimum acceptable reduction in the number of pins.

9. The process of claim 1, wherein the current model instances possess a timing attribute, wherein replacing the set of current model instances with a new set of model instances results in a change in the timing attribute, and wherein the initializing step further includes the step, performed by the data processing system, of initializing the benefit variable stored in the data base to a predetermined value representing a minimum acceptable change in the timing benefit.

10. The process of claim 1, wherein the performing step further includes the step, performed by the data processing system, of performing an action to decrease the number of current model instances in the data base.

11. A process of synthesizing a circuit design stored in a data processing system including a data base by replacing a set of current model instances each model instance consisting of a representation of a portion of an electrical circuit currently representing the circuit design in the data base with a new set of model instances and by altering attribute values stored in the data base and associated with objects in the data base by application of selected ones of a set of rules stored in the data base to associated ones of the current model instances, each of the rules including an antecedent portion that evaluates to one of TRUE and FALSE and including a consequence portion indicating an action, the antecedent portion comprising at least one test, the process comprising the steps, performed by the data processing system, of:

testing an antecedent portion of a rule in the set of rules stored in the data base, the rule being associated with a first current model instance stored in the data base; and performing the following substeps contained in a consequence portion of the rule when the antecedent portion is TRUE:

indicating a second current model instance stored in the data base and connected to the first current model instance, and applying a rule associated with the second current model instance to the second current model instance.

12. The process of claim 11, wherein the applying step further includes the step, performed by the data processing system, of applying a rule stored in the data base to the second current model instance to convert the second current model instance to a technology instance stored in the data base.

13. The process of claim 12, wherein the designating step further includes the step, performed by the data processing system, of inputting the name of a FROZEN model instance from a user.

14. The process of claim 12, wherein the designating step further includes the step, performed by the data processing system, of indicating a FROZEN model instance in a rule stored in the data base.

15. The process of claim 11, further including the steps, performed by the data processing system, of:

designating in the data base that a model instance is FROZEN to indicate that the model instance is not to be deleted or altered;

testing, during the antecedent portion testing step, whether the current model instance is FROZEN; and declining to replace FROZEN model instances.

16. A process of synthesizing a circuit design stored in a data processing system including a data base by replacing a set of current model instances each model instance consisting of a representation of a portion of an electrical circuit currently representing the circuit design in the data base with a new set of model instances and by altering attribute values stored in the data base and associated with objects in the data base by application of selected ones of a set of rules stored in the data base to associated ones of the current model instances, each of the rules including an antecedent portion that evaluates to one of TRUE and FALSE and including a consequence portion indicating an action, the antecedent portion comprising at least one test, the process comprising the steps, performed by the data processing system, of:

testing an antecedent portion of a rule in the set of rules, the rule associated with a current model instance stored in the data base; and performing the following substeps contained in a consequence portion of the rule when the antecedent portion is TRUE:

replacing the current model instance with a simpler new current model instance in the data base, and applying a rule associated with the new current model instance to the new current model instance.

17. The process of claim 16, further including the steps, performed by the data processing system, of:

designating in he data base that a model instance is FROZEN to indicate that the model instance is not to be deleted or altered;

testing, during the antecedent testing step, whether the current model instance is FROZEN; and declining to simplify FROZEN model instances.

18. The process of claim 17, wherein the designating step further includes the step, performed by the data processing system, of inputting the name of a FROZEN model instance from a user.

19. The process of claim 17, wherein the designating step further includes the step, performed by the data processing system, of indicating a FROZEN model instance in a rule stored in the data base.

20. An apparatus for synthesizing a circuit design stored in a data base of a data processing system by replacing a set of current model instances stored in the data base each model instance consisting of a representation of a portion of an electrical circuit currently representing the circuit design in the data base with a new set of model instances and by altering attribute values associated with objects in the data base by application of selected ones of a set of rules stored in the data base to associated ones of the current model instances, each of the rules including an antecedent portion that evaluates to one of TRUE and FALSE and including a consequence portion indicating an action, the antecedent portion comprising at least one test, the apparatus comprising:

a memory for storing the data base, including the set of rules and the model instances;

means for initializing a benefit variable stored in the memory to a predetermined value;

means for testing an antecedent portion of a rule in the set of rules, the antecedent portion including a plurality of subportions including a benefit variable subportion, the testing means including the following:

means for determining, according to an antecedent portion of the rule, a benefit value achieved by the rule, and means for determining, according to the antecedent portion of the rule, the benefit variable subportion to be TRUE when the determined benefit value is greater than the benefit variable stored in the memory;

means for determining the antecedent portion to be TRUE when all subportions of the antecedent portion are TRUE; and means for applying the rule by performing the action indicated by the consequence portion of the rule when the antecedent portion is TRUE.

21. The apparatus of claim 20, wherein the means for determining the benefit value further includes:

means for calculating a benefit value stored in the memory that will result from application of the rule.

22. The apparatus of claim 20, wherein the means for testing and applying operate for a rule associated with each current model instance.

23. The apparatus of claim 22, further including means for altering the benefit variable after the means for testing and applying have operated for a rule associated with each current model instance.

24. The apparatus of claim 23, wherein the means for altering further includes means for decrementing the benefit variable stored in the memory by a predetermined constant.

25. The apparatus of claim 23, wherein the means for altering further includes means for decrementing the benefit variable by a value that increases exponentially.

26. The apparatus of claim 23, wherein the means for altering further includes means for decrementing the benefit variable stored in the memory by a value that varies in accordance with a number of rule applications by the applying means for the current model instances.

27. The apparatus of claim 20, wherein the current model instances possess a current number of input and output pins, wherein replacing the set of current model instances with a new set of model instances results in a change in the total number of pins, and wherein the means for initializing further includes means for initializing the benefit variable stored in the memory to a predetermined value representing a minimum acceptable reduction in the number of pins.

28. The apparatus of claim 20, wherein the current model instances possess a timing attribute, wherein replacing the set of current model instances with a new set of model instances results in a change in the timing attribute, and wherein the means for initializing further includes means for initializing the benefit variable stored in the memory to a predetermined value representing a minimum acceptable change in the timing benefit.

29. The apparatus of claim 20, wherein the means for performing further includes means for performing an action to decrease the number of current model instances in the memory.

30. An apparatus for synthesizing a circuit design by replacing a set of current model instances stored in a data base of a data processing system, each model instance consisting of a representation of a portion of an electrical circuit currently representing the circuit design in a data base of the data processing system with a new set of model instances and by altering attribute values stored in the data base and associated with objects in the data base by application of selected ones of a set of rules stored in the data base to associated ones of the current model instances, each of the rules including an antecedent portion that evaluates to one of TRUE and FALSE and including a consequence portion indicating an action, the antecedent portion comprising at least one test, the apparatus comprising:

a memory for storing the data base, including the set of rules and the model instances;

means for testing an antecedent portion of a rule in the set of rules stored in the memory, the rule being associated with a first current model instance stored in the memory; and means for performing substeps contained in a consequence portion of the rule when the antecedent portion is TRUE, the performing means including:

means for indicating, according to a first substep in the consequence portion of the rule, a second current model instance stored in the memory and connected to the first current model instance, and means for applying, according to a second substep in the consequence portion of the rule, a rule associated with the second current model instance to the second current model instance.

31. The apparatus of claim 30, wherein the means for applying further includes means for applying a rule stored in the memory to the second current model instance to convert the second current model instance to a technology instance stored in the memory.

32. The apparatus of claim 31, wherein the means for designating further includes means for inputting the name of a FROZEN model instance from a user.

33. The apparatus of claim 31, wherein the means for designating further includes means for indicating a FROZEN model instance in a rule.

34. The apparatus of claim 30, further including:

means for designating in the memory that a model instance is FROZEN to indicate that the model instance is not to be deleted or altered;

means for testing whether the current model instance is FROZEN; and means for replacing only NON-FROZEN model instances.

35. An apparatus for synthesizing a circuit design stored in a data base of a data processing system by replacing a set of current model instances stored in the data base each model instance consisting of a representation of a portion of an electrical circuit currently representing the circuit design in the data base with a new set of model instances and by altering attribute values stored in the data base and associated with objects in the data base by application of selected ones of a set of rules stored in the data base to associated ones of the current model instances, each of the rules including an antecedent portion that evaluates to one of TRUE and FALSE and including a consequence portion indicating an action, the antecedent portion comprising at least one test, the apparatus comprising:

a memory for storing the data base, including the set of rules and the model instances;

means for testing an antecedent portion of a rule in the set of rules, the rule associated with a current model instance stored in the memory; and means for performing substeps contained in a consequence portion of the rule when the antecedent portion is TRUE, the performing means further including:

means for replacing the current model instance with a simpler new current model instance in the memory, according to a first substep in the consequence portion of the rule, and means for applying a rule associated with the new current model instance to the new current model instance, according to a second substep in the consequence portion of the rule.

36. The apparatus of claim 35, further including:

means for designating in the memory that a model instance is FROZEN to indicate that the model instance is not to be deleted or altered;

means for testing whether the current model instance is FROZEN; and means for simplifying only NON-FROZEN model instances.

37. The apparatus of claim 36, wherein the means for designating further includes means for inputting the name of a FROZEN model instance from a user.

38. The apparatus of claim 36, wherein the means for designating further includes means for indicating a FROZEN model instance in a rule.

* * * * *